US011402911B2

(12) United States Patent
Uttermann et al.

(10) Patent No.: US 11,402,911 B2
(45) Date of Patent: *Aug. 2, 2022

(54) CONTRACTING AND ELONGATING MATERIALS FOR PROVIDING INPUT AND OUTPUT FOR AN ELECTRONIC DEVICE

(71) Applicant: Apple Inc., Cupertino, CA (US)

(72) Inventors: Erik A. Uttermann, San Francisco, CA (US); Kevin D. Gibbs, San Carlos, CA (US); Dhaval Chandrakant Patel, San Jose, CA (US); Florence W. Ow, Los Altos Hills, CA (US); Derek W. Wright, San Francisco, CA (US); Stephen R. McClure, Belmont, CA (US); Inna Lobel, New York, NY (US)

(73) Assignee: Apple Inc., Cupertino, CA (US)

( * ) Notice: Subject to any disclaimer, the term of this patent is extended or adjusted under 35 U.S.C. 154(b) by 330 days.

This patent is subject to a terminal disclaimer.

(21) Appl. No.: 16/584,739

(22) Filed: Sep. 26, 2019

(65) Prior Publication Data

US 2020/0026359 A1 Jan. 23, 2020

Related U.S. Application Data

(63) Continuation of application No. 15/098,669, filed on Apr. 14, 2016, now Pat. No. 10,481,691.

(Continued)

(51) Int. Cl.
*G06F 3/01* (2006.01)
*G06F 3/041* (2006.01)
(Continued)

(52) U.S. Cl.
CPC .......... *G06F 3/016* (2013.01); *G06F 3/04144* (2019.05); *H01L 41/09* (2013.01); *H01L 41/1132* (2013.01); *H04B 1/3827* (2013.01)

(58) Field of Classification Search
CPC ....... G06F 3/016; G06F 3/0414; H01L 41/09; H01L 41/1132; H04B 1/3827
See application file for complete search history.

(56) References Cited

U.S. PATENT DOCUMENTS 3,001,049 A 9/1961 Didier
3,390,287 A 6/1968 Sonderegger
(Continued)

FOREIGN PATENT DOCUMENTS

AU 2015100710 7/2015
AU 2016100399 5/2016
(Continued)

OTHER PUBLICATIONS

Actuator definition downloaded from http://www.thefreedictionary.com/actuator on May 3, 2018, 2 pages.
(Continued)

*Primary Examiner* — Quan Zhen Wang
*Assistant Examiner* — Rajsheed O Black-Childress
(74) *Attorney, Agent, or Firm* — Brownstein Hyatt Farber Schreck, LLP

(57) ABSTRACT

Disclosed herein are methods and systems for providing haptic output on an electronic device. In some embodiments, the electronic device includes an actuator configured to move in a first direction. The electronic device also includes a substrate coupled to the actuator. When the actuator moves in the first direction, the substrate or a portion of the substrate, by virtue of being coupled to the actuator, moves in a second direction. In some implementations, the movement of the substrate is perpendicular to the movement of the actuator.

20 Claims, 27 Drawing Sheets

Related U.S. Application Data

(60) Provisional application No. 62/235,445, filed on Sep. 30, 2015, provisional application No. 62/152,400, filed on Apr. 24, 2015, provisional application No. 62/149,284, filed on Apr. 17, 2015.

(51) Int. Cl.
*H01L 41/09* (2006.01)
*H01L 41/113* (2006.01)
*H04B 1/3827* (2015.01)

(56) References Cited

U.S. PATENT DOCUMENTS

| | | |
|---|---|---|
| 3,419,739 A | 12/1968 | Clements |
| 4,236,132 A | 11/1980 | Zissimopoulos |
| 4,412,148 A | 10/1983 | Klicker et al. |
| 4,414,984 A | 11/1983 | Zarudiansky |
| 4,490,815 A | 12/1984 | Umehara et al. |
| 4,695,813 A | 9/1987 | Nobutoki et al. |
| 4,975,616 A | 12/1990 | Park |
| 5,010,772 A | 4/1991 | Bourland |
| 5,245,734 A | 9/1993 | Issartel |
| 5,283,408 A | 2/1994 | Chen |
| 5,293,161 A | 3/1994 | MacDonald et al. |
| 5,317,221 A | 5/1994 | Kubo et al. |
| 5,365,140 A | 11/1994 | Ohya et al. |
| 5,434,549 A | 7/1995 | Hirabayashi et al. |
| 5,436,622 A | 7/1995 | Gutman et al. |
| 5,510,584 A | 4/1996 | Norris |
| 5,510,783 A | 4/1996 | Findlater et al. |
| 5,513,100 A | 4/1996 | Parker et al. |
| 5,587,875 A | 12/1996 | Sellers |
| 5,590,020 A | 12/1996 | Sellers |
| 5,602,715 A | 2/1997 | Lempicki et al. |
| 5,619,005 A | 4/1997 | Shibukawa et al. |
| 5,621,610 A | 4/1997 | Moore et al. |
| 5,625,532 A | 4/1997 | Sellers |
| 5,629,578 A | 5/1997 | Winzer et al. |
| 5,635,928 A | 6/1997 | Takagi et al. |
| 5,718,418 A | 2/1998 | Gugsch |
| 5,739,759 A | 4/1998 | Nakazawa et al. |
| 5,742,242 A | 4/1998 | Sellers |
| 5,783,765 A | 7/1998 | Muramatsu |
| 5,793,605 A | 8/1998 | Sellers |
| 5,812,116 A | 9/1998 | Malhi |
| 5,813,142 A | 9/1998 | Demon |
| 5,818,149 A | 10/1998 | Safari et al. |
| 5,896,076 A | 4/1999 | Van Namen |
| 5,907,199 A | 5/1999 | Miller |
| 5,951,908 A | 9/1999 | Cui et al. |
| 5,959,613 A | 9/1999 | Rosenberg et al. |
| 5,973,441 A | 10/1999 | Lo et al. |
| 5,982,304 A | 11/1999 | Selker et al. |
| 5,982,612 A | 11/1999 | Roylance |
| 5,995,026 A | 11/1999 | Sellers |
| 5,999,084 A | 12/1999 | Armstrong |
| 6,035,257 A | 3/2000 | Epperson |
| 6,069,433 A | 5/2000 | Lazarus et al. |
| 6,078,308 A | 6/2000 | Rosenberg et al. |
| 6,104,947 A | 8/2000 | Heikkila et al. |
| 6,127,756 A | 10/2000 | Iwaki |
| 6,135,886 A | 10/2000 | Armstrong |
| 6,198,206 B1 | 3/2001 | Saarmaa |
| 6,218,966 B1 | 4/2001 | Goodwin |
| 6,219,033 B1 | 4/2001 | Rosenberg |
| 6,220,550 B1 | 4/2001 | McKillip, Jr. |
| 6,222,525 B1 | 4/2001 | Armstrong |
| 6,252,336 B1 | 6/2001 | Hall |
| 6,342,880 B2 | 1/2002 | Rosenberg et al. |
| 6,351,205 B1 | 2/2002 | Armstrong |
| 6,373,465 B2 | 4/2002 | Jolly et al. |
| 6,408,187 B1 | 6/2002 | Merriam |
| 6,411,276 B1 | 6/2002 | Braun et al. |
| 6,429,849 B1 | 8/2002 | An |
| 6,437,485 B1 | 8/2002 | Johansson |
| 6,438,393 B1 | 8/2002 | Surronen |
| 6,444,928 B2 | 9/2002 | Okamoto et al. |
| 6,455,973 B1 | 9/2002 | Ineson |
| 6,465,921 B1 | 10/2002 | Horng |
| 6,552,404 B1 | 4/2003 | Hynes |
| 6,552,471 B1 | 4/2003 | Chandran et al. |
| 6,557,072 B2 | 4/2003 | Osborn |
| 6,642,857 B1 | 11/2003 | Schediwy |
| 6,693,626 B1 | 2/2004 | Rosenberg |
| 6,717,573 B1 | 4/2004 | Shahoian et al. |
| 6,747,400 B2 | 6/2004 | Maichl et al. |
| 6,809,462 B2 | 10/2004 | Pelrine et al. |
| 6,809,727 B2 | 10/2004 | Piot et al. |
| 6,864,877 B2 | 3/2005 | Braun et al. |
| 6,906,697 B2 | 6/2005 | Rosenberg |
| 6,906,700 B1 | 6/2005 | Armstrong |
| 6,906,703 B2 | 6/2005 | Vablais et al. |
| 6,952,203 B2 | 10/2005 | Banerjee et al. |
| 6,954,657 B2 | 10/2005 | Bork et al. |
| 6,963,762 B2 | 11/2005 | Kaaresoja et al. |
| 6,965,189 B2 | 11/2005 | Menzel |
| 6,995,752 B2 | 2/2006 | Lu |
| 7,005,811 B2 | 2/2006 | Wakuda et al. |
| 7,016,707 B2 | 3/2006 | Fujisawa et al. |
| 7,022,927 B2 | 4/2006 | Hsu |
| 7,023,112 B2 | 4/2006 | Miyamoto et al. |
| 7,081,701 B2 | 7/2006 | Yoon et al. |
| 7,091,948 B2 | 8/2006 | Chang et al. |
| 7,121,147 B2 | 10/2006 | Okada |
| 7,123,948 B2 | 10/2006 | Nielsen |
| 7,130,664 B1 | 10/2006 | Williams |
| 7,136,045 B2 | 11/2006 | Rosenberg et al. |
| 7,158,122 B2 | 1/2007 | Roberts |
| 7,161,580 B2 | 1/2007 | Bailey et al. |
| 7,162,928 B2 | 1/2007 | Shank et al. |
| 7,170,498 B2 | 1/2007 | Huang |
| 7,176,906 B2 | 2/2007 | Williams et al. |
| 7,180,500 B2 | 2/2007 | Marvit et al. |
| 7,182,691 B1 | 2/2007 | Schena |
| 7,194,645 B2 | 3/2007 | Bieswanger et al. |
| 7,205,978 B2 | 4/2007 | Poupyrev |
| 7,217,891 B2 | 5/2007 | Fischer et al. |
| 7,218,310 B2 | 5/2007 | Tierling et al. |
| 7,219,561 B2 | 5/2007 | Okada |
| 7,253,350 B2 | 8/2007 | Noro et al. |
| 7,269,484 B2 | 9/2007 | Hein |
| 7,333,604 B2 | 2/2008 | Zernovizky et al. |
| 7,334,350 B2 | 2/2008 | Ellis |
| 7,348,968 B2 | 3/2008 | Dawson |
| 7,382,357 B2 | 6/2008 | Panotopoulos et al. |
| 7,388,741 B2 | 6/2008 | Konuma et al. |
| 7,392,066 B2 | 6/2008 | Hapamas |
| 7,423,631 B2 | 9/2008 | Shahoian et al. |
| 7,446,752 B2 | 11/2008 | Goldenberg et al. |
| 7,469,155 B2 | 12/2008 | Chu |
| 7,469,595 B2 | 12/2008 | Kessler et al. |
| 7,471,033 B2 | 12/2008 | Thiesen et al. |
| 7,495,358 B2 | 2/2009 | Kobayashi et al. |
| 7,508,382 B2 | 3/2009 | Denoue et al. |
| 7,561,142 B2 | 7/2009 | Shahoian et al. |
| 7,562,468 B2 | 7/2009 | Ellis |
| 7,569,086 B2 | 8/2009 | Chandran |
| 7,575,368 B2 | 8/2009 | Guillaume |
| 7,586,220 B2 | 9/2009 | Roberts |
| 7,619,498 B2 | 11/2009 | Miura |
| 7,639,232 B2 | 12/2009 | Grant et al. |
| 7,641,618 B2 | 1/2010 | Noda et al. |
| 7,647,196 B2 | 1/2010 | Kahn et al. |
| 7,649,305 B2 | 1/2010 | Priya et al. |
| 7,675,253 B2 | 3/2010 | Dorel |
| 7,675,414 B2 | 3/2010 | Ray |
| 7,679,611 B2 | 3/2010 | Schena |
| 7,707,742 B2 | 5/2010 | Ellis |
| 7,710,399 B2 | 5/2010 | Bruneau et al. |
| 7,732,951 B2 | 6/2010 | Mukaide |
| 7,737,828 B2 | 6/2010 | Yang et al. |
| 7,742,036 B2 | 6/2010 | Grant et al. |
| 7,788,032 B2 | 8/2010 | Moloney |

(56) References Cited

U.S. PATENT DOCUMENTS

| | | |
|---|---|---|
| 7,793,429 B2 | 9/2010 | Ellis |
| 7,793,430 B2 | 9/2010 | Ellis |
| 7,798,982 B2 | 9/2010 | Zets et al. |
| 7,868,489 B2 | 1/2011 | Amemiya et al. |
| 7,886,621 B2 | 2/2011 | Smith et al. |
| 7,888,892 B2 | 2/2011 | McReynolds et al. |
| 7,893,922 B2 | 2/2011 | Klinghult et al. |
| 7,919,945 B2 | 4/2011 | Houston et al. |
| 7,929,382 B2 | 4/2011 | Yamazaki |
| 7,946,483 B2 | 5/2011 | Miller et al. |
| 7,952,261 B2 | 5/2011 | Lipton et al. |
| 7,952,566 B2 | 5/2011 | Poupyrev et al. |
| 7,956,770 B2 | 6/2011 | Klinghult et al. |
| 7,961,909 B2 | 6/2011 | Mandella et al. |
| 8,018,105 B2 | 9/2011 | Erixon et al. |
| 8,031,172 B2 | 10/2011 | Kruse et al. |
| 8,044,940 B2 | 10/2011 | Narusawa |
| 8,069,881 B1 | 12/2011 | Cunha |
| 8,072,418 B2 | 12/2011 | Crawford et al. |
| 8,077,145 B2 | 12/2011 | Rosenberg et al. |
| 8,081,156 B2 | 12/2011 | Ruettiger |
| 8,082,640 B2 | 12/2011 | Takeda |
| 8,084,968 B2 | 12/2011 | Murray et al. |
| 8,098,234 B2 | 1/2012 | Lacroix et al. |
| 8,123,660 B2 | 2/2012 | Kruse et al. |
| 8,125,453 B2 | 2/2012 | Shahoian et al. |
| 8,141,276 B2 | 3/2012 | Ellis |
| 8,156,809 B2 | 4/2012 | Tierling et al. |
| 8,169,401 B2 | 5/2012 | Hardwick |
| 8,174,344 B2 | 5/2012 | Yakima et al. |
| 8,174,372 B2 | 5/2012 | da Costa |
| 8,179,027 B2 | 5/2012 | Barta et al. |
| 8,179,202 B2 | 5/2012 | Cruz-Hernandez et al. |
| 8,188,623 B2 | 5/2012 | Park |
| 8,205,356 B2 | 6/2012 | Ellis |
| 8,210,942 B2 | 7/2012 | Shimabukuro et al. |
| 8,232,494 B2 | 7/2012 | Purcocks |
| 8,242,641 B2 | 8/2012 | Bae |
| 8,248,277 B2 | 8/2012 | Peterson et al. |
| 8,248,278 B2 | 8/2012 | Schlosser et al. |
| 8,253,686 B2 | 8/2012 | Kyung et al. |
| 8,255,004 B2 | 8/2012 | Huang et al. |
| 8,261,468 B2 | 9/2012 | Ellis |
| 8,264,465 B2 | 9/2012 | Grant et al. |
| 8,270,114 B2 | 9/2012 | Argumedo et al. |
| 8,270,148 B2 | 9/2012 | Griffith et al. |
| 8,288,899 B2 | 10/2012 | Park et al. |
| 8,291,614 B2 | 10/2012 | Ellis |
| 8,294,600 B2 | 10/2012 | Peterson et al. |
| 8,315,746 B2 | 11/2012 | Cox et al. |
| 8,339,250 B2 | 12/2012 | Je et al. |
| 8,344,834 B2 | 1/2013 | Niiyama |
| 8,345,013 B2 | 1/2013 | Heubel et al. |
| 8,373,549 B2 | 2/2013 | Fadell et al. |
| 8,378,797 B2 | 2/2013 | Pance et al. |
| 8,378,798 B2 | 2/2013 | Bells et al. |
| 8,378,965 B2 | 2/2013 | Gregorio et al. |
| 8,384,316 B2 | 2/2013 | Houston et al. |
| 8,384,679 B2 | 2/2013 | Paleczny et al. |
| 8,388,346 B2 | 3/2013 | Rantala et al. |
| 8,390,594 B2 | 3/2013 | Modarres et al. |
| 8,395,587 B2 | 3/2013 | Cauwels et al. |
| 8,398,570 B2 | 3/2013 | Mortimer et al. |
| 8,405,618 B2 | 3/2013 | Colgate et al. |
| 8,411,058 B2 | 4/2013 | Wong et al. |
| 8,446,264 B2 | 5/2013 | Tanase |
| 8,451,255 B2 | 5/2013 | Weber et al. |
| 8,452,345 B2 | 5/2013 | Lee et al. |
| 8,461,951 B2 | 6/2013 | Gassmann et al. |
| 8,466,889 B2 | 6/2013 | Tong et al. |
| 8,471,690 B2 | 6/2013 | Hennig et al. |
| 8,487,759 B2 | 7/2013 | Hill |
| 8,515,398 B2 | 8/2013 | Song et al. |
| 8,542,134 B2 | 9/2013 | Peterson et al. |
| 8,545,322 B2 | 10/2013 | George et al. |
| 8,547,341 B2 | 10/2013 | Takashima et al. |
| 8,547,350 B2 | 10/2013 | Anglin et al. |
| 8,552,859 B2 | 10/2013 | Pakula et al. |
| 8,570,291 B2 | 10/2013 | Motomura |
| 8,575,794 B2 | 11/2013 | Lee et al. |
| 8,587,955 B2 | 11/2013 | DiFonzo et al. |
| 8,593,409 B1 | 11/2013 | Heubel |
| 8,598,893 B2 | 12/2013 | Camus |
| 8,599,047 B2 | 12/2013 | Schlosser et al. |
| 8,599,152 B1 | 12/2013 | Wurtenberger et al. |
| 8,600,354 B2 | 12/2013 | Esaki |
| 8,614,431 B2 | 12/2013 | Huppi et al. |
| 8,621,348 B2 | 12/2013 | Ramsay et al. |
| 8,629,843 B2 | 1/2014 | Steeves et al. |
| 8,633,916 B2 | 1/2014 | Bernstein et al. |
| 8,674,941 B2 | 3/2014 | Casparian et al. |
| 8,680,723 B2 | 3/2014 | Subramanian |
| 8,681,092 B2 | 3/2014 | Harada et al. |
| 8,682,396 B2 | 3/2014 | Yang et al. |
| 8,686,952 B2 | 4/2014 | Burrough et al. |
| 8,710,966 B2 | 4/2014 | Hill |
| 8,717,309 B2 | 5/2014 | Almalki |
| 8,723,813 B2 | 5/2014 | Park et al. |
| 8,733,540 B2 | 5/2014 | Woiler et al. |
| 8,735,755 B2 | 5/2014 | Peterson et al. |
| 8,760,273 B2 | 6/2014 | Casparian et al. |
| 8,760,413 B2 | 6/2014 | Peterson et al. |
| 8,780,060 B2 | 7/2014 | Maschmeyer et al. |
| 8,787,006 B2 | 7/2014 | Golko et al. |
| 8,797,152 B2 | 8/2014 | Henderson et al. |
| 8,798,534 B2 | 8/2014 | Rodriguez et al. |
| 8,803,842 B2 | 8/2014 | Wakasugi et al. |
| 8,816,981 B2 | 8/2014 | Kai et al. |
| 8,836,502 B2 | 9/2014 | Culbert et al. |
| 8,857,248 B2 | 10/2014 | Shih et al. |
| 8,860,562 B2 | 10/2014 | Hill |
| 8,861,776 B2 | 10/2014 | Lastrucci |
| 8,866,600 B2 | 10/2014 | Yang et al. |
| 8,890,666 B2 | 11/2014 | Parker et al. |
| 8,890,668 B2 | 11/2014 | Pance et al. |
| 8,918,215 B2 | 12/2014 | Bosscher et al. |
| 8,928,621 B2 | 1/2015 | Ciesla et al. |
| 8,947,383 B2 | 2/2015 | Ciesla et al. |
| 8,948,821 B2 | 2/2015 | Newham et al. |
| 8,952,937 B2 | 2/2015 | Shih et al. |
| 8,970,534 B2 | 3/2015 | Adachi et al. |
| 8,976,141 B2 | 3/2015 | Myers et al. |
| 9,008,730 B2 | 4/2015 | Kim et al. |
| 9,012,795 B2 | 4/2015 | Niu |
| 9,013,426 B2 | 4/2015 | Cole et al. |
| 9,019,088 B2 | 4/2015 | Zawacki et al. |
| 9,024,738 B2 | 5/2015 | Van Schyndel et al. |
| 9,035,887 B1 | 5/2015 | Prud'Hommeaux et al. |
| 9,072,576 B2 | 7/2015 | Nishiura |
| 9,083,821 B2 | 7/2015 | Hughes |
| 9,092,129 B2 | 7/2015 | Abdo et al. |
| 9,098,984 B2 | 8/2015 | Heubel et al. |
| 9,098,991 B2 | 8/2015 | Park et al. |
| 9,117,347 B2 | 8/2015 | Matthews |
| 9,122,325 B2 | 9/2015 | Peshkin et al. |
| 9,131,039 B2 | 9/2015 | Behles |
| 9,134,834 B2 | 9/2015 | Reshef |
| 9,141,225 B2 | 9/2015 | Cok et al. |
| 9,158,379 B2 | 10/2015 | Cruz-Hernandez et al. |
| 9,178,509 B2 | 11/2015 | Bernstein |
| 9,189,932 B2 | 11/2015 | Kerdemelidis et al. |
| 9,201,458 B2 | 12/2015 | Hunt et al. |
| 9,202,355 B2 | 12/2015 | Hill |
| 9,219,401 B2 | 12/2015 | Kim et al. |
| 9,235,267 B2 | 1/2016 | Pope et al. |
| 9,274,601 B2 | 3/2016 | Faubert et al. |
| 9,274,602 B2 | 3/2016 | Garg et al. |
| 9,274,603 B2 | 3/2016 | Modarres et al. |
| 9,275,815 B2 | 3/2016 | Hoffmann |
| 9,285,923 B2 | 3/2016 | Liao et al. |
| 9,293,054 B2 | 3/2016 | Bruni et al. |
| 9,300,181 B2 | 3/2016 | Maeda et al. |
| 9,310,906 B2 | 4/2016 | Yumiki et al. |
| 9,310,950 B2 | 4/2016 | Takano et al. |

(56) References Cited

U.S. PATENT DOCUMENTS

| | | |
|---|---|---|
| 9,317,116 B2 | 4/2016 | Ullrich et al. |
| 9,317,118 B2 | 4/2016 | Puskarich |
| 9,317,154 B2 | 4/2016 | Perlin et al. |
| 9,318,942 B2 | 4/2016 | Sugita et al. |
| 9,325,230 B2 | 4/2016 | Yamada et al. |
| 9,330,544 B2 | 5/2016 | Levesque et al. |
| 9,357,052 B2 | 5/2016 | Ullrich |
| 9,360,944 B2 | 6/2016 | Pinault |
| 9,367,238 B2 | 6/2016 | Tanada |
| 9,380,145 B2 | 6/2016 | Tartz et al. |
| 9,390,599 B2 | 7/2016 | Weinberg |
| 9,396,434 B2 | 7/2016 | Rothkopf |
| 9,405,369 B2 | 8/2016 | Modarres et al. |
| 9,411,423 B2 | 8/2016 | Heubel |
| 9,417,695 B2 | 8/2016 | Griffin et al. |
| 9,430,042 B2 | 8/2016 | Levin |
| 9,448,628 B2 | 9/2016 | Tan et al. |
| 9,448,713 B2 | 9/2016 | Cruz-Hernandez et al. |
| 9,449,476 B2 | 9/2016 | Lynn |
| 9,452,268 B2 | 9/2016 | Badaye et al. |
| 9,454,239 B2 | 9/2016 | Elias et al. |
| 9,467,033 B2 | 10/2016 | Jun et al. |
| 9,468,846 B2 | 10/2016 | Terrell et al. |
| 9,471,172 B2 | 10/2016 | Sirois |
| 9,477,342 B2 | 10/2016 | Daverman et al. |
| 9,480,947 B2 | 11/2016 | Jiang et al. |
| 9,501,912 B1 | 11/2016 | Havskjold et al. |
| 9,542,028 B2 | 1/2017 | Filiz et al. |
| 9,544,694 B2 | 1/2017 | Abe et al. |
| 9,564,029 B2 | 2/2017 | Morrell et al. |
| 9,576,445 B2 | 2/2017 | Cruz-Hernandez |
| 9,595,659 B2 | 3/2017 | Kim |
| 9,600,070 B2 | 3/2017 | Chatterjee et al. |
| 9,608,506 B2 | 3/2017 | Degner et al. |
| 9,622,214 B2 | 4/2017 | Ryu |
| 9,640,048 B2 | 5/2017 | Hill |
| 9,652,040 B2 | 5/2017 | Martinez et al. |
| 9,659,482 B2 | 5/2017 | Yang et al. |
| 9,665,198 B2 | 5/2017 | Kies et al. |
| 9,692,286 B2 | 6/2017 | Endo et al. |
| 9,594,450 B2 | 7/2017 | Lynn et al. |
| 9,696,803 B2 | 7/2017 | Curz-Hernandez et al. |
| 9,727,157 B2 | 8/2017 | Ham et al. |
| 9,733,704 B2 | 8/2017 | Cruz-Hernandez et al. |
| 9,746,945 B2 | 8/2017 | Sheynblat et al. |
| 9,778,743 B2 | 10/2017 | Grant et al. |
| 9,779,592 B1 | 10/2017 | Hoen |
| 9,785,251 B2 | 10/2017 | Martisauskas |
| 9,823,833 B2 | 11/2017 | Grant et al. |
| 9,830,782 B2 | 11/2017 | Morrell et al. |
| 9,831,871 B2 | 11/2017 | Lee et al. |
| 9,836,123 B2 | 12/2017 | Gipson et al. |
| 9,846,484 B2 | 12/2017 | Shah |
| 9,857,872 B2 | 1/2018 | Terlizzi et al. |
| 9,870,053 B2 | 1/2018 | Modarres et al. |
| 9,886,093 B2 | 2/2018 | Moussette et al. |
| 9,891,708 B2 | 2/2018 | Cruz-Hernandez et al. |
| 9,904,393 B2 | 2/2018 | Frey et al. |
| 9,911,553 B2 | 3/2018 | Bernstein |
| 9,928,950 B2 | 3/2018 | Lubinski et al. |
| 9,934,661 B2 | 4/2018 | Hill |
| 9,970,757 B2 | 5/2018 | Das et al. |
| 9,990,099 B2 | 6/2018 | Ham et al. |
| 9,997,306 B2 | 6/2018 | Bernstein |
| 10,013,058 B2 | 7/2018 | Puskarich et al. |
| 10,032,550 B1 | 7/2018 | Zhang |
| 10,038,361 B2 | 7/2018 | Hajati et al. |
| 10,039,080 B2 | 7/2018 | Miller et al. |
| 10,061,386 B2 | 8/2018 | Frescas et al. |
| 10,062,832 B2 | 8/2018 | Caraveo et al. |
| 10,067,585 B2 | 9/2018 | Kim |
| 10,069,392 B2 | 9/2018 | Degner et al. |
| 10,108,151 B2 | 10/2018 | Cardinali et al. |
| 10,108,265 B2 | 10/2018 | Harley et al. |
| 10,120,446 B2 | 11/2018 | Pance et al. |
| 10,126,817 B2 | 11/2018 | Morrell et al. |
| 10,127,778 B2 | 11/2018 | Hajati et al. |
| 10,133,352 B2 | 11/2018 | Lee et al. |
| 10,139,907 B2 | 11/2018 | Billington |
| 10,139,959 B2 | 11/2018 | Butler et al. |
| 10,152,116 B2 | 12/2018 | Wang et al. |
| 10,198,097 B2 | 2/2019 | Lynn et al. |
| 10,204,494 B2 | 2/2019 | Do et al. |
| 10,236,760 B2 | 3/2019 | Moussette et al. |
| 10,268,272 B2 | 4/2019 | Chen |
| 10,276,001 B2 | 4/2019 | Smith et al. |
| 10,289,199 B2 | 5/2019 | Hoellwarth et al. |
| 10,338,682 B2 | 7/2019 | Heubel et al. |
| 10,345,905 B2 | 7/2019 | McClure et al. |
| 10,353,382 B2 | 7/2019 | Bodenstein |
| 10,353,467 B2 | 7/2019 | Augenbergs et al. |
| 10,367,950 B2 | 7/2019 | Davis et al. |
| 10,372,250 B2 | 8/2019 | Zhang et al. |
| 10,416,811 B2 | 9/2019 | Abdollahian et al. |
| 10,423,214 B2 | 9/2019 | Mistry et al. |
| 10,429,929 B2 | 10/2019 | Sulem et al. |
| 10,436,607 B2 | 10/2019 | Chen et al. |
| 10,444,834 B2 | 10/2019 | Vescovi |
| 10,444,841 B2 | 10/2019 | Nakamura et al. |
| 10,456,622 B2 | 10/2019 | Szabados et al. |
| 10,459,521 B2 | 10/2019 | Puskarich |
| 10,481,692 B2 | 11/2019 | Ullrich et al. |
| 11,165,382 B2 | 11/2021 | Creary et al. |
| 2002/0194284 A1 | 12/2002 | Haynes |
| 2003/0210259 A1 | 11/2003 | Liu |
| 2004/0021663 A1 | 2/2004 | Suzuki et al. |
| 2004/0127198 A1 | 7/2004 | Roskind et al. |
| 2005/0057528 A1 | 3/2005 | Kleen |
| 2005/0107129 A1 | 5/2005 | Kaewell et al. |
| 2005/0110778 A1 | 5/2005 | Ben Ayed |
| 2005/0118922 A1 | 6/2005 | Endo |
| 2005/0217142 A1 | 10/2005 | Ellis |
| 2005/0237306 A1 | 10/2005 | Klein et al. |
| 2005/0248549 A1 | 11/2005 | Dietz et al. |
| 2005/0258715 A1 | 11/2005 | Schlabach |
| 2006/0014569 A1 | 1/2006 | DelGiorno |
| 2006/0154674 A1 | 7/2006 | Landschaft et al. |
| 2006/0209037 A1 | 9/2006 | Wang et al. |
| 2006/0239746 A1 | 10/2006 | Grant |
| 2006/0252463 A1 | 11/2006 | Liao |
| 2007/0032270 A1 | 2/2007 | Orr |
| 2007/0043725 A1 | 2/2007 | Hotelling et al. |
| 2007/0099574 A1 | 5/2007 | Wang |
| 2007/0152974 A1 | 7/2007 | Kim et al. |
| 2007/0168430 A1 | 7/2007 | Brun et al. |
| 2007/0178942 A1 | 8/2007 | Sadler et al. |
| 2007/0188450 A1 | 8/2007 | Hernandez et al. |
| 2008/0084384 A1 | 4/2008 | Gregorio et al. |
| 2008/0165148 A1 | 7/2008 | Williamson |
| 2008/0181501 A1 | 7/2008 | Faraboschi |
| 2008/0181706 A1 | 7/2008 | Jackson |
| 2008/0192014 A1 | 8/2008 | Kent et al. |
| 2008/0204428 A1 | 8/2008 | Pierce et al. |
| 2008/0255794 A1 | 10/2008 | Levine |
| 2009/0002328 A1 | 1/2009 | Ullrich et al. |
| 2009/0015560 A1 | 1/2009 | Robinson et al. |
| 2009/0115734 A1 | 5/2009 | Fredriksson et al. |
| 2009/0120105 A1 | 5/2009 | Ramsay et al. |
| 2009/0128503 A1 | 5/2009 | Grant et al. |
| 2009/0135142 A1 | 5/2009 | Fu et al. |
| 2009/0167702 A1 | 7/2009 | Nurmi |
| 2009/0218148 A1 | 9/2009 | Hugeback et al. |
| 2009/0225046 A1 | 9/2009 | Kim et al. |
| 2009/0236210 A1 | 9/2009 | Clark et al. |
| 2009/0267892 A1 | 10/2009 | Faubert |
| 2009/0291670 A1 | 11/2009 | Sennett et al. |
| 2010/0020036 A1 | 1/2010 | Hui et al. |
| 2010/0053087 A1 | 3/2010 | Dai et al. |
| 2010/0089735 A1 | 4/2010 | Takeda et al. |
| 2010/0110018 A1 | 5/2010 | Faubert et al. |
| 2010/0141408 A1 | 6/2010 | Doy et al. |
| 2010/0141606 A1 | 6/2010 | Bae et al. |
| 2010/0148944 A1 | 6/2010 | Kim et al. |
| 2010/0152620 A1 | 6/2010 | Ramsay et al. |

(56) References Cited

U.S. PATENT DOCUMENTS

| | | |
|---|---|---|
| 2010/0164894 A1 | 7/2010 | Kim et al. |
| 2010/0188422 A1 | 7/2010 | Shingai et al. |
| 2010/0231508 A1 | 9/2010 | Cruz-Hernandez et al. |
| 2010/0265197 A1 | 10/2010 | Purdy |
| 2010/0328229 A1 | 12/2010 | Weber et al. |
| 2011/0007023 A1 | 1/2011 | Abrahamsson et al. |
| 2011/0053577 A1 | 3/2011 | Lee et al. |
| 2011/0107958 A1 | 5/2011 | Pance et al. |
| 2011/0121765 A1 | 5/2011 | Anderson et al. |
| 2011/0128239 A1 | 6/2011 | Polyakov et al. |
| 2011/0148608 A1 | 6/2011 | Grant et al. |
| 2011/0156539 A1 | 6/2011 | Park et al. |
| 2011/0157052 A1 | 6/2011 | Lee et al. |
| 2011/0163985 A1 | 7/2011 | Bae et al. |
| 2011/0216013 A1 | 9/2011 | Siotis |
| 2011/0248948 A1 | 10/2011 | Griffin et al. |
| 2011/0260988 A1 | 10/2011 | Colgate et al. |
| 2011/0263200 A1 | 10/2011 | Thornton et al. |
| 2011/0291950 A1 | 12/2011 | Tong |
| 2011/0304559 A1 | 12/2011 | Pasquero |
| 2012/0075198 A1 | 3/2012 | Sulem et al. |
| 2012/0092263 A1 | 4/2012 | Peterson et al. |
| 2012/0105333 A1* | 5/2012 | Maschmeyer .......... G06F 3/016 345/173 |
| 2012/0126959 A1 | 5/2012 | Zarrabi et al. |
| 2012/0133494 A1 | 5/2012 | Cruz-Hernandez et al. |
| 2012/0139844 A1 | 6/2012 | Ramstein et al. |
| 2012/0206248 A1 | 8/2012 | Biggs |
| 2012/0256848 A1 | 10/2012 | Madabusi Srinivasan |
| 2012/0274578 A1 | 11/2012 | Snow et al. |
| 2012/0280927 A1 | 11/2012 | Ludwig |
| 2012/0319987 A1 | 12/2012 | Woo |
| 2012/0327006 A1 | 12/2012 | Israr et al. |
| 2013/0027345 A1 | 1/2013 | Binzel |
| 2013/0033967 A1 | 2/2013 | Chuang et al. |
| 2013/0043987 A1 | 2/2013 | Kasama et al. |
| 2013/0058816 A1 | 3/2013 | Kim |
| 2013/0106699 A1 | 5/2013 | Babatunde |
| 2013/0191741 A1 | 7/2013 | Dickinson et al. |
| 2013/0207793 A1 | 8/2013 | Weaber et al. |
| 2013/0217491 A1 | 8/2013 | Hilbert et al. |
| 2013/0228023 A1 | 9/2013 | Drasnin et al. |
| 2013/0261811 A1 | 10/2013 | Yagi et al. |
| 2013/0300590 A1 | 11/2013 | Dietz et al. |
| 2014/0082490 A1 | 3/2014 | Jung et al. |
| 2014/0085065 A1 | 3/2014 | Biggs et al. |
| 2014/0132528 A1 | 5/2014 | Catton |
| 2014/0143785 A1 | 5/2014 | Mistry et al. |
| 2014/0168153 A1 | 6/2014 | Deichmann et al. |
| 2014/0197936 A1 | 7/2014 | Biggs et al. |
| 2014/0232534 A1 | 8/2014 | Birnbaum et al. |
| 2014/0267076 A1 | 9/2014 | Birnbaum et al. |
| 2015/0005039 A1 | 1/2015 | Liu et al. |
| 2015/0040005 A1 | 2/2015 | Faaborg |
| 2015/0098309 A1 | 4/2015 | Adams et al. |
| 2015/0169059 A1 | 6/2015 | Behles et al. |
| 2015/0194165 A1 | 7/2015 | Faaborg et al. |
| 2015/0205355 A1 | 7/2015 | Yairi |
| 2015/0205417 A1 | 7/2015 | Yairi et al. |
| 2015/0296480 A1 | 10/2015 | Kinsey et al. |
| 2016/0103544 A1 | 4/2016 | Filiz et al. |
| 2016/0206921 A1 | 7/2016 | Szabados et al. |
| 2016/0216766 A1 | 7/2016 | Puskarich |
| 2016/0241119 A1 | 8/2016 | Keeler |
| 2016/0306423 A1 | 10/2016 | Uttermann et al. |
| 2017/0038905 A1 | 2/2017 | Bijamov et al. |
| 2017/0070131 A1 | 3/2017 | Degner et al. |
| 2017/0090667 A1 | 3/2017 | Abdollahian et al. |
| 2017/0153703 A1 | 6/2017 | Yun et al. |
| 2017/0192508 A1 | 7/2017 | Lim et al. |
| 2017/0242541 A1 | 8/2017 | Iuchi et al. |
| 2017/0255295 A1 | 9/2017 | Tanemura et al. |
| 2017/0311282 A1 | 10/2017 | Miller et al. |
| 2017/0345992 A1 | 11/2017 | Noguchi |
| 2017/0357325 A1 | 12/2017 | Yang et al. |
| 2017/0364158 A1 | 12/2017 | Wen et al. |
| 2018/0059793 A1 | 3/2018 | Hajati |
| 2018/0060941 A1 | 3/2018 | Yang et al. |
| 2018/0075715 A1 | 3/2018 | Morrell et al. |
| 2018/0081441 A1 | 3/2018 | Pedder et al. |
| 2018/0174409 A1 | 6/2018 | Hill |
| 2018/0203513 A1 | 7/2018 | Rihn |
| 2018/0302881 A1 | 10/2018 | Miller et al. |
| 2019/0027674 A1 | 1/2019 | Zhang et al. |
| 2019/0159170 A1 | 5/2019 | Miller et al. |
| 2019/0214895 A1 | 7/2019 | Moussette et al. |
| 2019/0250713 A1 | 8/2019 | Chen |
| 2020/0027320 A1 | 1/2020 | Hill |

FOREIGN PATENT DOCUMENTS

| | | |
|---|---|---|
| CA | 2355434 | 2/2002 |
| CN | 1324030 | 11/2001 |
| CN | 1692371 | 11/2005 |
| CN | 1817321 | 8/2006 |
| CN | 101120290 | 2/2008 |
| CN | 101409164 | 4/2009 |
| CN | 101763192 | 6/2010 |
| CN | 101903848 | 12/2010 |
| CN | 101938207 | 1/2011 |
| CN | 102025257 | 4/2011 |
| CN | 102057656 | 5/2011 |
| CN | 201829004 | 5/2011 |
| CN | 102163076 | 8/2011 |
| CN | 102246122 | 11/2011 |
| CN | 102315747 | 1/2012 |
| CN | 102591512 | 7/2012 |
| CN | 102667681 | 9/2012 |
| CN | 102713805 | 10/2012 |
| CN | 102754054 | 10/2012 |
| CN | 102768593 | 11/2012 |
| CN | 102844972 | 12/2012 |
| CN | 102915111 | 2/2013 |
| CN | 103019569 | 4/2013 |
| CN | 103154867 | 6/2013 |
| CN | 103155410 | 6/2013 |
| CN | 103181090 | 6/2013 |
| CN | 103218104 | 7/2013 |
| CN | 103278173 | 9/2013 |
| CN | 103416043 | 11/2013 |
| CN | 103440076 | 12/2013 |
| CN | 103567135 | 2/2014 |
| CN | 103970339 | 8/2014 |
| CN | 104049746 | 9/2014 |
| CN | 104220963 | 12/2014 |
| CN | 104917885 | 9/2015 |
| CN | 104956244 | 9/2015 |
| CN | 105556268 | 5/2016 |
| CN | 208013890 | 10/2018 |
| DE | 19517630 | 11/1996 |
| DE | 10330024 | 1/2005 |
| DE | 102008027720 | 12/2009 |
| DE | 102009038103 | 2/2011 |
| DE | 102011115762 | 4/2013 |
| EP | 0483955 | 5/1992 |
| EP | 1047258 | 10/2000 |
| EP | 1686776 | 8/2006 |
| EP | 2060967 | 5/2009 |
| EP | 2073099 | 6/2009 |
| EP | 2194444 | 6/2010 |
| EP | 2207080 | 7/2010 |
| EP | 2264562 A2 | 12/2010 |
| EP | 2315186 | 4/2011 |
| EP | 2374430 | 10/2011 |
| EP | 2395414 | 12/2011 |
| EP | 2461228 | 6/2012 |
| EP | 2631746 | 8/2013 |
| EP | 2434555 | 10/2013 |
| EP | 2148339 | 7/2015 |
| JP | H05301342 A2 | 11/1993 |
| JP | 2001095290 | 4/2001 |
| JP | 2002199689 | 7/2002 |
| JP | 2002102799 | 9/2002 |
| JP | 200362525 | 3/2003 |

(56) References Cited

FOREIGN PATENT DOCUMENTS

| | | |
|---|---|---|
| JP | 2003527046 | 9/2003 |
| JP | 200494389 | 3/2004 |
| JP | 2004236202 | 8/2004 |
| JP | 2006150865 | 6/2006 |
| JP | 3831410 | 10/2006 |
| JP | 2007519099 | 7/2007 |
| JP | 200818928 | 1/2008 |
| JP | 2010536040 | 11/2010 |
| JP | 2010272903 | 12/2010 |
| JP | 2011523840 | 8/2011 |
| JP | 2012135755 | 7/2012 |
| JP | 2013149124 | 8/2013 |
| JP | 2014002729 | 1/2014 |
| JP | 2014509028 | 4/2014 |
| JP | 2014235133 | 12/2014 |
| JP | 2014239323 | 12/2014 |
| JP | 2015153406 | 8/2015 |
| JP | 2015228214 | 12/2015 |
| JP | 2016095552 | 5/2016 |
| KR | 20050033909 | 4/2005 |
| KR | 1020100046602 | 5/2010 |
| KR | 1020110101516 | 9/2011 |
| KR | 20130024420 | 3/2013 |
| TW | 200518000 | 11/2007 |
| TW | 200951944 | 12/2009 |
| TW | 201145336 | 12/2011 |
| TW | 201218039 | 5/2012 |
| TW | 201425180 | 7/2014 |
| WO | WO 97/016932 | 5/1997 |
| WO | WO 00/051190 | 8/2000 |
| WO | WO 01/059558 | 8/2001 |
| WO | WO 01/089003 | 11/2001 |
| WO | WO 02/073587 | 9/2002 |
| WO | WO 03/038800 | 5/2003 |
| WO | WO 03/100550 | 12/2003 |
| WO | WO 06/057770 | 6/2006 |
| WO | WO 07/114631 | 10/2007 |
| WO | WO 08/075082 | 6/2008 |
| WO | WO 09/038862 | 3/2009 |
| WO | WO 09/068986 | 6/2009 |
| WO | WO 09/097866 | 8/2009 |
| WO | WO 09/122331 | 10/2009 |
| WO | WO 09/150287 | 12/2009 |
| WO | WO 10/085575 | 7/2010 |
| WO | WO 10/087925 | 8/2010 |
| WO | WO 11/007263 | 1/2011 |
| WO | WO 12/052635 | 4/2012 |
| WO | WO 12/129247 | 9/2012 |
| WO | WO 13/069148 | 5/2013 |
| WO | WO 13/150667 | 10/2013 |
| WO | WO 13/169299 | 11/2013 |
| WO | WO 13/169302 | 11/2013 |
| WO | WO 13/173838 | 11/2013 |
| WO | WO 13/186846 | 12/2013 |
| WO | WO 13/186847 | 12/2013 |
| WO | WO 14/018086 | 1/2014 |
| WO | WO 14/098077 | 6/2014 |
| WO | WO 15/023670 | 2/2015 |
| WO | WO 16/141482 | 9/2016 |
| WO | WO 17/027792 | 2/2017 |

OTHER PUBLICATIONS

Astronomer's Toolbox, "The Electromagnetic Spectrum," http://imagine.gsfc.nasa.gov/science/toolbox/emspectrum1.html, updated Mar. 2013, 4 pages.

Hasser et al., "Preliminary Evaluation of a Shape-Memory Alloy Tactile Feedback Display," Advances in Robotics, Mechantronics, and Haptic Interfaces, ASME, DSC—vol. 49, pp. 73-80, 1993.

Hill et al., "Real-time Estimation of Human Impedance for Haptic Interfaces," Stanford Telerobotics Laboratory, Department of Mechanical Engineering, Stanford University, Third Joint Eurohaptics Conference and Symposium on Haptic Interfaces for Virtual Environment and Teleoperator Systems, Salt Lake City, Utah, Mar. 18-20, 2009, pp. 440-445.

Kim et al., "Tactile Rendering of 3D Features on Touch Surfaces," UIST '13, Oct. 8-11, 2013, St. Andrews, United Kingdom, 8 pages.

Lee et al, "Haptic Pen: Tactile Feedback Stylus for Touch Screens," Mitsubishi Electric Research Laboratories, http://wwwlmerl.com, 6 pages, Oct. 2004.

Nakamura, "A Torso Haptic Display Based on Shape Memory Alloy Actuators," Massachusetts Institute of Technology, 2003, pp. 1-123.

PuntoCellulare, "LG-GD910 3G Watch Phone," YouTube (http://www.youtube.com/watch?v+HcCI87KIELM), Jan. 8, 2009, 9 pages.

Sullivan, Mark, "This Android Wear Update Turns Your Device into The Dick Tracy Watch," Fast Company (https://www.fastcompany.com/3056319/this-android-wear-update-turns-your-device-into-the-dick-tracy-watch), Feb. 4, 2016, 9 pages.

* cited by examiner

CONTRACTING AND ELONGATING MATERIALS FOR PROVIDING INPUT AND OUTPUT FOR AN ELECTRONIC DEVICE

CROSS-REFERENCE TO RELATED APPLICATIONS

This application is a continuation of U.S. patent application Ser. No. 15/098,669, filed Apr. 14, 2016, and titled "Contracting and Elongating Materials for Providing Input and Output for an Electronic Device," and is a nonprovisional patent application of and claims the benefit of U.S. Provisional Patent Application No. 62/149,284, filed Apr. 17, 2015 and titled "Contracting and Elongating Materials for Providing Input and Output for an Electronic Device," U.S. Provisional Patent Application No. 62/152,400, filed Apr. 24, 2015 and titled "Contracting and Elongating Materials for Providing Input and Output for an Electronic Device," and U.S. Provisional Patent Application No. 62/235,445 filed Sep. 30, 2015 and titled "Contracting and Elongating Materials for Providing Input and Output for an Electronic Device," the disclosures of each of which are hereby incorporated herein by reference in their entireties.

FIELD

The present disclosure generally relates to using various materials for providing input and output for an electronic device. More specifically, the present disclosure is directed to using piezoelectric materials or electroactive polymers for receiving input and for providing haptic output for an electronic device.

BACKGROUND

Electronic devices are commonplace in today's society. Example electronic devices include cell phones, tablet computers, personal digital assistants, and the like. Some of these electronic devices include an ability to notify an individual of a particular item of interest. For example, electronic devices may notify the individual about an incoming phone call, an incoming electronic message, a news story of interest, and so on.

In some instances, when the notification is received, the electronic device provides a haptic notification to the individual. The haptic notification may include a vibratory output that is used to draw the individual's attention to the item of interest. The haptic output may be provided by an actuator that utilizes a vibratory motor or an oscillating motor.

SUMMARY

Disclosed herein are methods and systems for providing tactile or haptic output on an electronic device. In some embodiments, the electronic device includes an actuator configured to move in a first direction. The electronic device also includes a substrate coupled to the actuator. When the actuator moves in the first direction, the substrate, or a portion of the substrate, by virtue of being coupled to the actuator, moves in a second direction. In some implementations, the movement of the substrate is perpendicular to the movement of the actuator.

Also disclosed is an electronic device having a first actuator and a second actuator. In this particular implementation, the first actuator is coupled to a substrate at a first location. The first actuator is configured to move in a first direction. The electronic device also includes a second actuator coupled to the substrate at a second location that is different from the first location. Like the first actuator, the second actuator is configured to move in the first direction. When either the first actuator or the second actuator, or a combination of both of the first actuator and the second actuator, move in the first direction, the substrate is configured to move in a second direction. Movement of the substrate in the second direction causes a haptic output on a surface of the electronic device at one or more of the first location and the second location.

A method for providing a haptic output on an electronic device is also disclosed. In some implementations, the method includes applying a first input signal to a first actuator which causes the first actuator to move in a first direction. In response to the first actuator moving in the first direction, a substrate that is coupled to the first actuator moves in a second direction. Movement of the substrate in the second direction causes the haptic output.

A haptic structure for an electronic device is also disclosed. The haptic structure provides haptic output for the electronic device. The haptic structure includes an actuator, a first electrode coupled to a first side of the actuator, and a second electrode coupled to a second side of the actuator. The haptic structure also includes a first substrate and a second substrate that are coupled to the first electrode and the second electrode respectively. When a stimulus is applied to the actuator, the first substrate and the second substrate deflect. Deflection of the first substrate and the second substrate causes a haptic output for the electronic device.

Also disclosed is an electronic device having a cover glass, a haptic structure, and a force-sensing element. The haptic structure is operative to deflect the cover glass. When the cover glass is deflected, a haptic output may be perceived by a user. The force-sensing element is operative to detect an amount of force provided on the cover glass.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
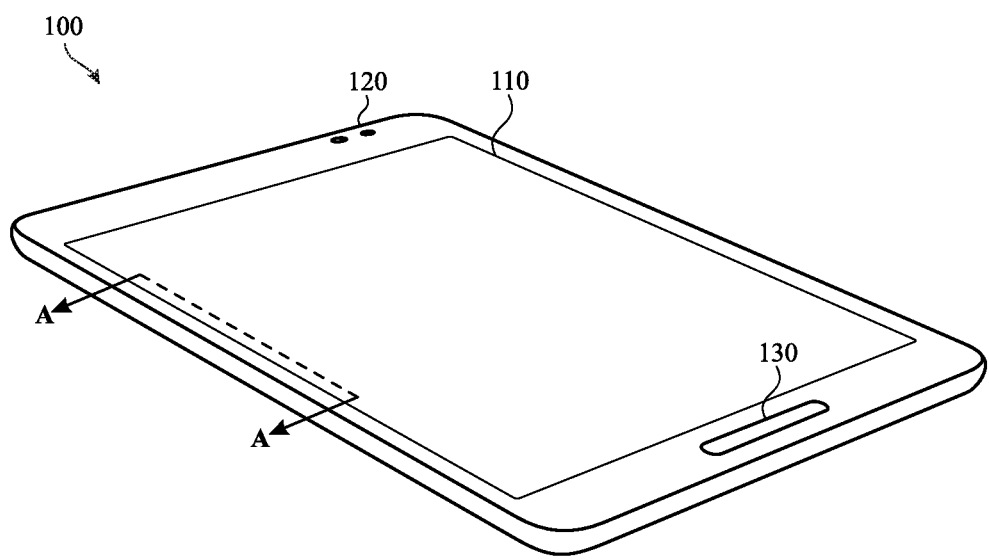
FIG. 1A illustrates an example electronic device that may incorporate a haptic structure that provides haptic output and a force-sensing element that detects an amount of received force.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to providing haptic output on an electronic device. The haptic output may be provided in response to an event associated with the electronic device. Such events include, but are not limited to, a button press, an event associated with an application that is being executed on the electronic device, an alarm, a displayed image, an incoming or outgoing electronic message, an incoming or outgoing telephone call, and the like.

However, unlike conventional haptic actuators that utilize vibratory or oscillating motors, the haptic output of the present disclosure is provided by a haptic structure. The haptic structure may include an actuator coupled to a substrate. The actuator is configured to move in a first direction, which causes the substrate to move in a second direction. As the substrate moves in the second direction, haptic output is provided on a surface of the electronic device.

As will be described below, the surface on which the haptic output is provided may be a housing of the electronic device. In another implementation, the haptic output may be provided on a cover glass or a display of the electronic device. The haptic output may also be provided on or underneath an input element, display, output element, or other structure of the electronic device.

The actuator of the haptic structure described herein may deform or otherwise change shape. When the actuator changes its shape, one or more dimensions of the actuator may change. As a result of this change, the substrate to which the actuator is coupled may also deform or otherwise change shape. For example, as the actuator moves or otherwise changes its shape and/or dimensions, the force caused by the change in the actuator is transferred to the substrate. As a result, the substrate moves and/or deflects which provides the haptic output.

For example, and as will be described below, the actuator of the haptic structure may be a piezoelectric material that bends, contracts, and/or expands in response to a received voltage. As the piezoelectric material contracts or expands, the substrate may deflect; for example, a flat substrate may bow convexly or concavely. The movement of the substrate in this manner provides a haptic output that can be felt by a person touching the substrate or touching a surface above or below the substrate.

In some embodiments, a haptic structure may include a single actuator. In another embodiment, a haptic structure can include multiple actuators (e.g., an array of actuators) with each actuator coupled to a different portion or region of a substrate of the haptic structure. In this configuration, a first input signal may be provided to a first actuator to cause the first actuator to provide a first haptic output while a second input signal may be provided to a second actuator to cause the second actuator to provide a second haptic output. In other implementations, multiple haptic structures (e.g., those with single actuators or multiple actuators) may be arranged in an array. Each haptic structure in the array may be driven by various input signals at different times.

The haptic structure of the present disclosure may be placed or otherwise coupled to various surfaces of the electronic device in order to provide haptic output. For example, in some implementations, the actuator or the haptic structure may be coupled to a cover glass of a display of the electronic device. In other implementations, the actuator or the haptic structure may be placed underneath a display or coupled to one or more components of the display of the electronic device. In still yet other implementations, the haptic structure may be coupled on, coupled behind, or otherwise coupled to a housing, a button, a trackpad, or other input component of the electronic device.

The haptic structure described herein may be combined, coupled or otherwise associated with a band, strap or other such accessory that may be part of or associated with the electronic device. In still other embodiments, the haptic structure may be associated or integrated with a cover, a case, headphones, a display, a keyboard, a mouse, or other such input device. In each implementation, as the actuator of the haptic structure changes shape or moves in a particular direction, a haptic output may be provided.

A single haptic structure may be used in the electronic device to provide haptic output at a single location on the electronic device. The single haptic structure may also be used to provide haptic output at multiple locations on the electronic device. For example, a first portion of the haptic structure may be driven at a first location within the electronic device to provide haptic output at the first location. Likewise, a second portion of the haptic structure may be driven at a second location within the electronic device to provide haptic output at the second location. In other implementations, multiple haptic structures may be used to provide the haptic output at the various locations.

When multiple haptic structures are used, or when a haptic structure includes multiple sections that may be driven individually, each actuator of each haptic structure, or each section of the haptic structure, may be actuated simultaneously, substantially simultaneously, or sequentially.

In other implementations, each actuator of each haptic structure, or each section of the haptic actuator, may be actuated individually. For example, a first actuator (or a section of the haptic structure) may be actuated without activating the second actuator (or a second section of the haptic structure). In other cases, each actuator, or the sections of the haptic structure, may be selectively actuated to offset movement of the substrate at respective locations.

For example, if an actuator of the haptic structure is actuated at a first location, a substrate of the haptic structure may move at the first location. Movement of the substrate at that location may cause movement (either desired movement or undesired movement) at a second location. As such, a second actuator or haptic structure may be actuated at the second location to offset, dampen, or otherwise negate movement of the substrate at the second location. Selective actuation in this manner may more effectively localize the feedback at the first location. In other cases, the second actuator may be actuated at the second location to enhance the haptic output of the haptic structure at the first location and/or the second location.

The actuation of the haptic structure or the actuator of the electronic device may be tuned to the resonance of the structure to which it is coupled. For example, if the haptic structure is coupled to a display or a cover glass of the display, the actuator may be tuned to the resonance of the cover glass or the display thereby increasing the impact or perceptibility of the provided haptic output.

The haptic structure may also be used in conjunction with a force-sensing element. For example, the haptic structure and a force-sensing element may be incorporated into a single electronic device. Thus, the force-sensing element may be operative to detect force input received on a surface of the electronic device and the haptic structure may provide haptic output on the surface of the electronic device.

These and other embodiments are discussed below with reference to FIGS. 1A-21. However, those skilled in the art will readily appreciate that the detailed description given herein with respect to these Figures is for explanatory purposes only and should not be construed as limiting.

Figure 1B:
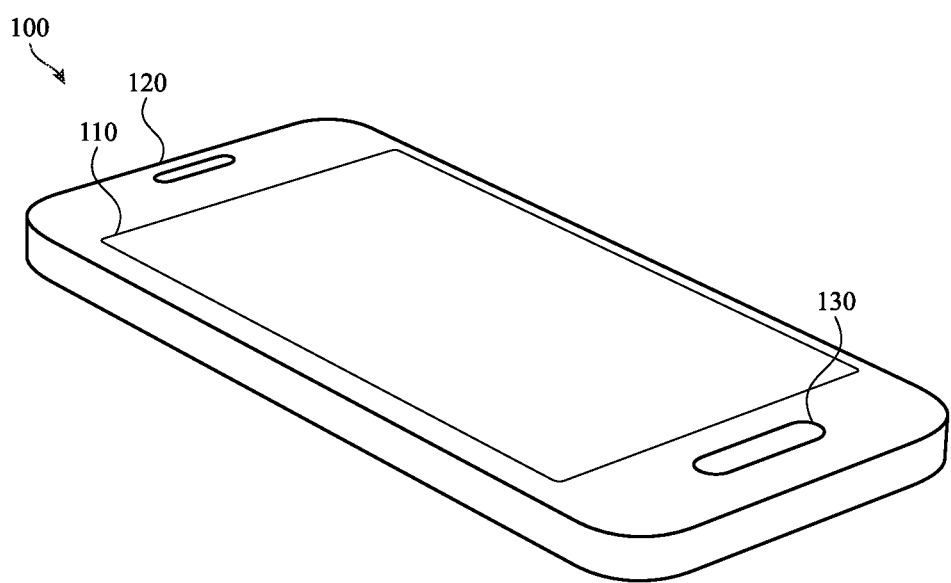
FIG. 1B illustrates another example electronic device that may incorporate a haptic structure that provides haptic output and a force-sensing element that detects an amount of received force.
Figure 1C:
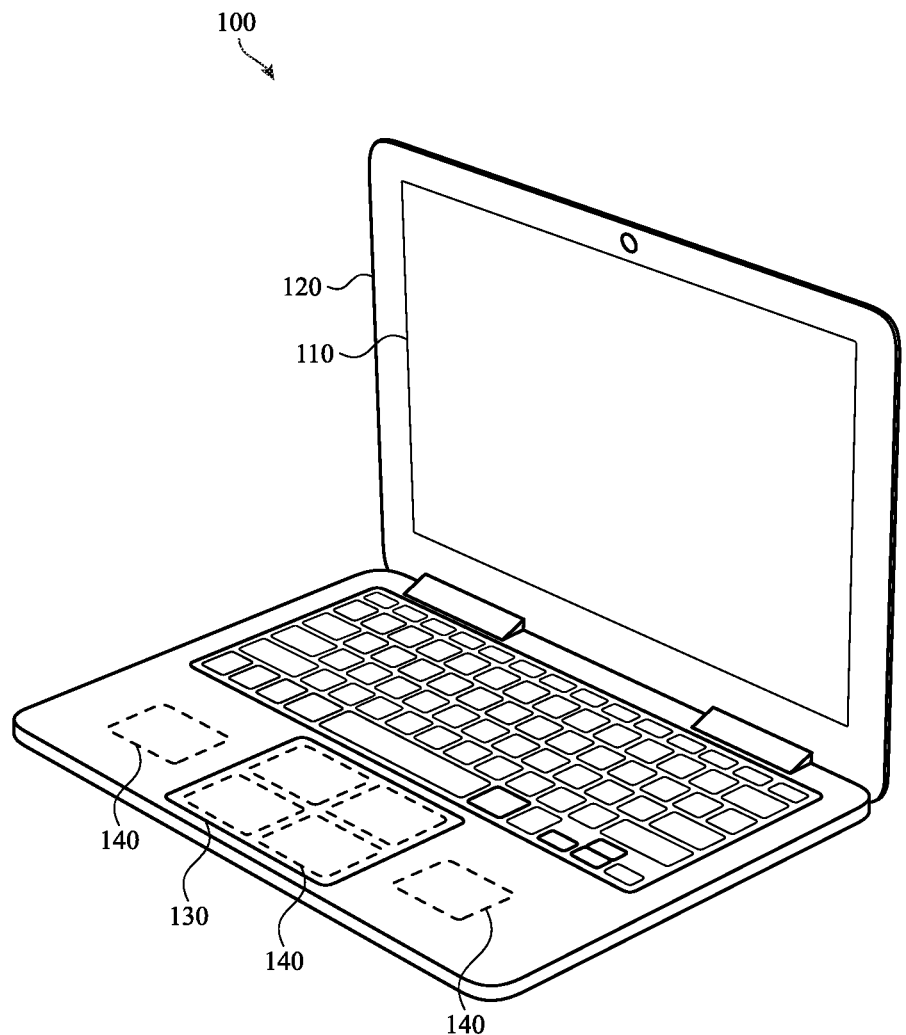
FIG. 1C illustrates yet another example electronic device that may incorporate a haptic structure that provides haptic output and a force-sensing element that detects an amount of received force.

FIG. 1A illustrates an example electronic device 100 that may incorporate a haptic structure and a force-sensing element according to one or more embodiments of the present disclosure. The haptic structure may provide a haptic output for the electronic device 100 and the force-sensing element may detect an amount of force received by or otherwise provided on a surface or input mechanism of the electronic device 100. As shown in FIG. 1A, the electronic device 100 may be a tablet computing device. In other implementations, the electronic device 100 may be a mobile phone such as shown in FIG. 1B. The electronic device 100 may also be a laptop computer such as shown in FIG. 1C. Although FIGS. 1A-1C show different electronic devices 100, like reference numerals are used to designate similar components. For example, each electronic device 100 may include a display. As such, reference numeral 110 is used to designate the display of each electronic device 100.

Although specific electronic devices are shown in the figures and described below, the haptic structure and the force-sensing element described herein may be used with various electronic devices including, but not limited to, a time keeping device, a health monitoring device, a wearable electronic device, an input device, a desktop computer, electronic glasses, and so on. Although various electronic devices are mentioned, the haptic structure and the force-sensing element of the present disclosure may also be used in conjunction with other products and combined with various materials.

The electronic device 100 may include a display 110, a housing 120, and one or more input mechanisms 130. As will be explained below, the display 110, the housing 120, and the one or more input mechanisms 130 may each be coupled to a haptic structure such that haptic output is provided directly on each component. For example, the haptic structure may be coupled to the display 110 and/or a cover glass of the display 110. Thus, when the actuator causes the haptic structure to move, the display 110 also moves which provides the haptic output.

In some embodiments, the display 110 may be a touch-sensitive display that detects and measures the location of a touch on a surface of the display 110. Thus, when a touch sensor detects the location of the touch, an electronic signal may drive one or more haptic structures at the detected location which causes haptic output at that location. The touch sensor may be a capacitive-based touch sensor that is disposed relative to the display 110 or a display stack of the electronic device 100. Although a capacitive-based touch sensor is disclosed, other sensors may be used.

The electronic device 100 may also include a force-sensing element that uses a force sensor to detect and measure the magnitude of force of a touch on a surface of the electronic device 100. The surface may be, for example, the display 110, a track pad (FIG. 1C), or some other input device or surface.

The haptic structure of the present disclosure may be combined or otherwise integrated with the touch sensor or the force sensor and may provide both input and output capabilities. For example, the haptic structure may provide haptic output at or near the location of any detected touch input. The haptic structure may also provide various types of haptic output depending on the detected amount of force. In addition, the haptic structure may be used to detect received input such as will be described below.

The electronic device 100 may include a housing 120 that encloses one or more components of the electronic device 100. The housing 120 may also be coupled to an actuator or a haptic structure. For example, and as shown in FIG. 1C, one or more haptic structures 140 may be coupled to the housing 120 of the electronic device 100. When the actuator of the haptic structure 140 is driven, haptic output may be provided on the housing 120.

The haptic structure 140 may also be used in conjunction with or be coupled to the input mechanism 130. For example, one or more haptic structures 140 may be coupled to a trackpad and/or a force sensitive input device of a computing device (e.g., laptop computer, tablet computer, desktop computer, and so on) such as shown in FIG. 1C.

The haptic structure 140 disclosed herein may also be used in place of the input mechanism 130, or as an additional input mechanism. For example, the haptic structure 140 may be used as an input device. In such implementations, the input mechanism 130 may be integrated with any portion or part of the electronic device 100. For example, a haptic structure 140 may be placed on, underneath or otherwise integrated with the housing 120, a cover glass, and/or a display 110 of the electronic device 100.

In response to a compressive force received at or near the location of the haptic structure 140, the haptic structure 140 may generate a charge or current that is measurable by an electronic component of the electronic device 100. A processing element may sense this charge and accept it as an input. Such an input may be binary (e.g., counted as an input if the charge or current exceeds a threshold) or variable across a continuum (e.g., different generated charges/currents equate to different inputs or differences in a particular type of input).

To continue the example, the amount of charge generated by the haptic structure 140 may vary based on the type of input received. For example, if an amount of current generated or detected is above a first threshold, it may indicate that a first type of touch input is received (e.g., a quick touch or press). If an amount of current generated or detected is above a second threshold, it may indicate that a second type of touch input is received (e.g., a long touch or press).

The haptic structure 140 may also work in conjunction with one or more force-sensing elements or one or more force sensors to determine an amount of force that is applied to a surface of the electronic device 100. In addition, the haptic structure 140 may be used to determine the location of the received input, and to determine one or more gestures associated with the received input. For example, if a haptic structure or a series of haptic structures detect touch input over a certain time period and over a certain distance on a surface of the electronic device 100, a swipe gesture may be detected.

Figure 2A:
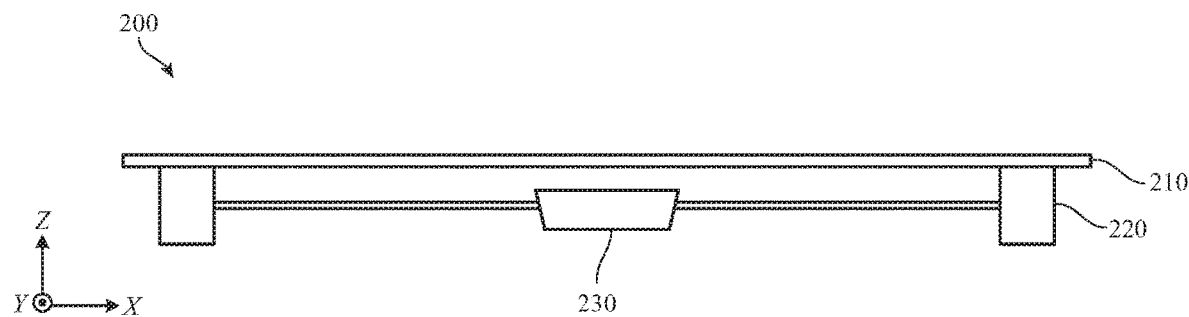
FIG. 2A illustrates an example haptic structure for an electronic device in an inactive state.
Figure 2B:
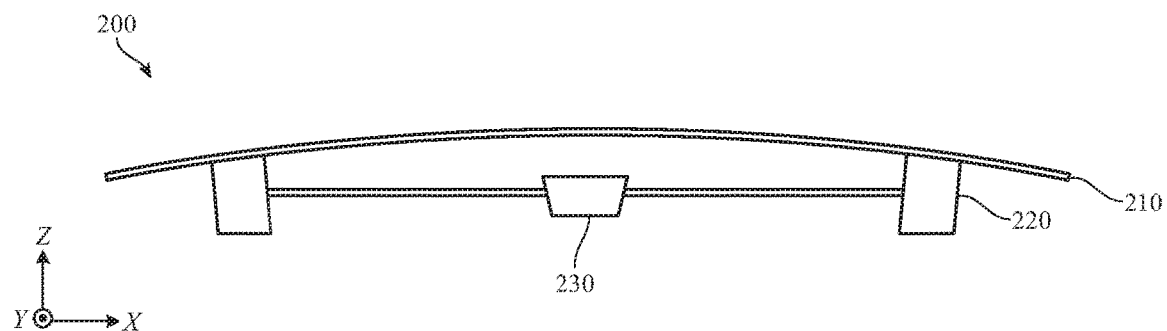
FIG. 2B illustrates the example haptic structure of FIG. 2A in an active state including a curve or deflection in a substrate of the haptic structure.

FIG. 2A illustrates an example haptic structure 200 for an electronic device in an inactive state and FIG. 2B illustrates the example haptic structure 200 of FIG. 2A in an active state according to one or more embodiments of the present disclosure. The haptic structure 200 may be used with the example electronic devices 100 shown and described above with respect to FIGS. 1A-1C.

The haptic structure 200 may include a substrate 210 and an actuation mechanism 230. The actuation mechanism 230 may be coupled to the substrate 210 using one or more connection mechanisms 220. The substrate 210 may be made of glass, aluminum, fabric, or may be part of a display module or display stack of the electronic device. As previously discussed, the substrate 210 may be a cover glass of an electronic device, a housing of the electronic device, and so on. Although the haptic structure 200 is specifically discussed with respect to an electronic device, the haptic structure 200 may be used with other devices including mechanical devices and electrical devices, as well as non-mechanical and non-electrical devices.

The actuation mechanism 230 of the haptic structure 200 may be any type of actuator that moves from a first position to a second position. More specifically, the actuation mechanism 230 may be any actuator that moves or that can be driven (e.g., using a current, voltage, input signal, or other electrical field) in a first direction. For example, the actuator may contract, moving a first end of the actuator toward a second end of the actuator. The actuator may contract along an axis, may move one or both ends in one or more directions, may bow or otherwise assume a convex or concave shape, and so on. In some embodiments, the actuator is driven at a frequency of approximately 50 Hz-500 Hz although other frequencies may be used.

In response to the movement of the actuation mechanism 230 in the first direction, the substrate 210 may move to a second position or may move in a second direction. The second direction may be perpendicular to the first direction. More specifically, the substrate 210 may move in the second direction when the substrate 210 is constrained in some manner such as, for example, having a fixed boundary.

In some embodiments, a periphery or outer edge of the substrate 210 may be coupled or secured to a housing (or other portion) of the electronic device. Because the periphery of the substrate 210 is coupled or otherwise secured to the housing, movement of the actuator in the first direction causes the substrate 210 to move in the second direction. In some implementations, the entire periphery of the substrate 210 is not coupled to the housing. Rather, the edges of the substrate 210 that are located in or otherwise associated with the movement of the actuator are secured to the housing.

The actuation mechanism 230 may be a piston, a solenoid, or other mechanical device that moves or otherwise causes the actuation mechanism 230, or a component of the actuation mechanism 230, to move, expand or contract. In response to the movement of the actuation mechanism 230, the constrained substrate 210 that is coupled to the actuation mechanism 230 may move in a direction that is different from the direction of movement of the actuation mechanism 230.

For example and as shown in FIG. 2B, movement of the actuation mechanism 230 in the first direction causes the one or more connection mechanisms 220 to move. Movement of the connection mechanism 220 causes the substrate 210 to bow, bend, or otherwise deflect. For example, when the actuation mechanism 230 contracts, movement of the connection mechanisms 220 causes the substrate 210 to deflect in a z-direction.

When the haptic structure 200 deflects in such a manner, haptic output is provided on a surface of the electronic device. For example, if the haptic structure 200 is included as part of a display or a display stack of an electronic device, deflection of the substrate 210 may transfer energy to the top of the display stack which also causes the display stack to bend or deflect. The deflection of the display stack may be felt or perceived by a user of the electronic device.

In some cases, deflection of the substrate may be approximately 10 microns or less in the z-direction. In other cases, deflection of the substrate 210 may be approximately 5 microns or less in the z-direction or may even be approximately 1 micron in the z-direction. In yet other implementations, the movement range may be greater than 10 microns such as, for example, 1 mm or greater or 2 mm or greater. Although displacement in the z-direction is specifically mentioned, other implementations may enable the substrate to move in the x-plane, the y-plane, and/or the z-plane. Movement of the substrate 210 in any of the directions may provide haptic output that may be felt or perceived by the user of the electronic device.

Although the actuation mechanism 230 is shown being connected to two different ends of the substrate 210, this is not required. In some implementations, the actuation mechanism 230 may be configured as a cantilevered beam that is coupled to the substrate 210. As the actuation mechanism 230 is actuated, the beam moves from a first position, or a nominal position, to a second position. Movement of the beam from the first position to the second position may cause the substrate 210 to bend or deflect such as described above.

Figure 3A:
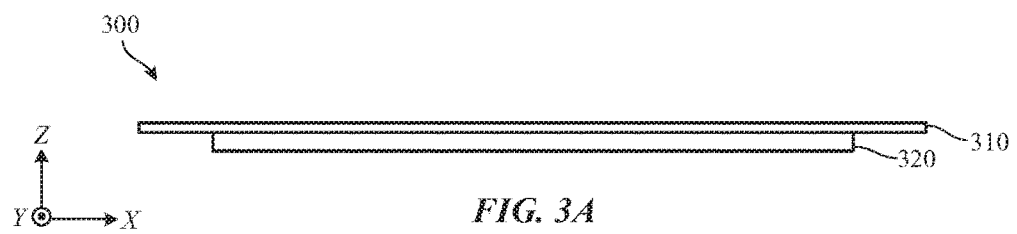
FIG. 3A illustrates another example haptic structure for an electronic device in an inactive state.
Figure 3B:
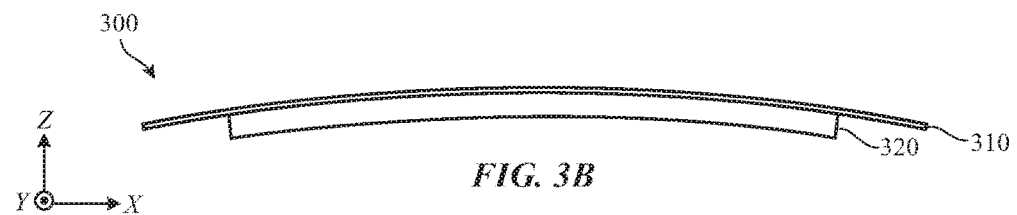
FIG. 3B illustrates the example haptic structure of FIG. 3A in an active state including a curve or deflection in a substrate of the haptic structure.

FIG. 3A illustrates another example haptic structure 300 for an electronic device in an inactive state and FIG. 3B illustrates the example haptic structure 300 of FIG. 3A in an active state according to one or more embodiments of the present disclosure. As with the haptic structure 200 described above, the haptic structure 300 shown in FIG. 3A and FIG. 3B includes a substrate 310 and an actuator 320 coupled to the substrate.

In this example, the actuator 320 may be a piezoelectric actuator or may include a piezoelectric material. In other embodiments, the actuator 320 may be an electroactive polymer. The actuator 320 may also be made of nitinol or other matter that changes its shape and/or one or more dimensions in response to a stimulus.

As such, the haptic structure 300 may include one or more electrodes that are coupled to the piezoelectric material. The actuator 320 may also be coupled to the substrate 310 using an epoxy or other such material. When a voltage is applied to the electrodes or to the actuator 320, the actuator 320 contracts. Contraction of the actuator 320 causes the substrate 310 to deflect, change shape, or move in a particular direction. For example and as shown in FIG. 3B, contraction of the actuator 320 causes the substrate 310 to deflect in the z-direction.

Deflection of the substrate 310 in the manner described may provide a haptic output to a user of the electronic device. More specifically, as the substrate 310 deflects, one or more portions of the electronic device that incorporates the haptic structure 300 may also deflect. For example, if the haptic structure 300 is part of or placed under a cover glass of the electronic device, deflection of the haptic structure 300 may also cause the cover glass of the electronic device to deflect. Likewise, if the haptic structure 300 is located beneath a portion of the housing or a button of the electronic device, deflection of the haptic structure 300 would also cause that portion of the housing or the button to deflect.

Although deflection of the substrate 310 is specifically mentioned, movement of the actuator 320 (or the actuation mechanism 230 of FIG. 2) may cause the substrate 310 of the haptic structure 300 to move from its nominal position to a state in which the substrate 310 is concave. For example, expansion or other such movement of the actuator 320 may cause the substrate 310 to be concave. In other embodiments, the actuator 320 may be coupled to the substrate 310 at a location at which contraction of the actuator 320 causes the substrate 310 to be concave.

Figure 4A:
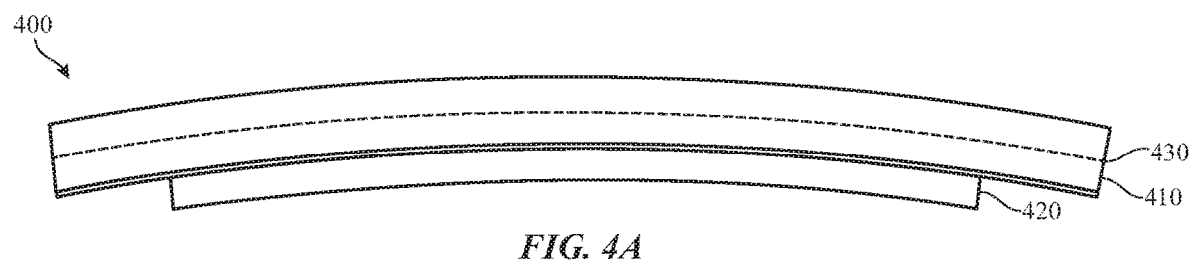
FIG. 4A illustrates a first configuration of a haptic structure in which an actuator of the haptic structure is below a neutral axis.
Figure 4B:
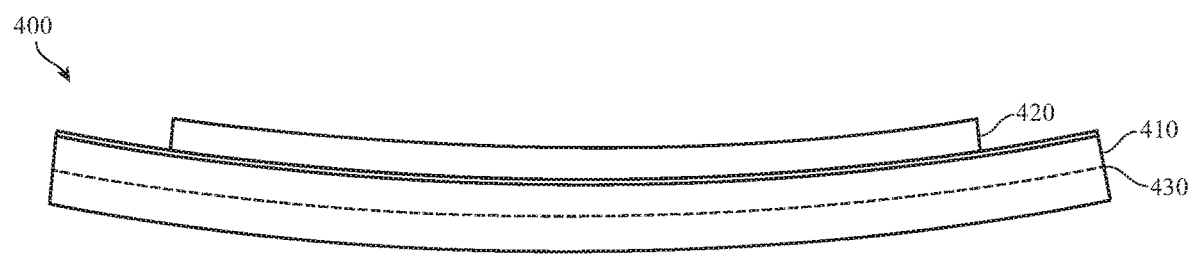
FIG. 4B illustrates a second configuration of a haptic structure in which an actuator of the haptic structure is above a neutral axis.

FIG. 4A illustrates a first configuration of a haptic structure 400 in which an actuator 420 of the haptic structure 400 is below a neutral axis 430. FIG. 4B illustrates a second configuration of a haptic structure 400 in which the actuator 420 of the haptic structure 400 is positioned above a neutral axis 430. As with the other haptic structures disclosed herein, the haptic structure 400 includes a substrate 410 coupled to the actuator 420. The actuator 420 may be a mechanical actuator, an electroactive polymer, a piezoelectric material, and so on. The actuator 420 may be coupled to the substrate 410 using an epoxy or other such material. One or more electrodes may also be coupled to the actuator 420. When a voltage, electrical field, or other stimulus is applied to the actuator 420, the actuator 420 may contract which causes the substrate 410 to deflect such as shown.

The substrate 410 may have a neutral axis 430. As used herein, a neutral axis 430 of the substrate 410 is an axis in which the substrate 410 does not have longitudinal stresses or strains. In addition, the length of the substrate 410 does not change at the neutral axis 430 when the substrate 410 bends. Thus, if the actuator 420 is placed below the neutral axis 430, the substrate 410 may deflect or deform such as shown in FIG. 4A. Likewise, if the actuator 420 is placed above the neutral axis 430, the substrate 410 may be deformed or be concave such as shown in FIG. 4B.

In some embodiments, the haptic structure 400 of the present disclosure may be used to harvest energy. For example, when the haptic structure 400 includes a piezoelectric material, the piezoelectric material may form or otherwise include transducers that covert the strain or force caused by the bending of the substrate 410 into electrical energy. As a result, each time the actuator or the haptic structure 400 is activated, the bending motion of the substrate 410 may be converted into electrical energy that may be subsequently stored and/or used to power other components of the electronic device.

Figure 5A:
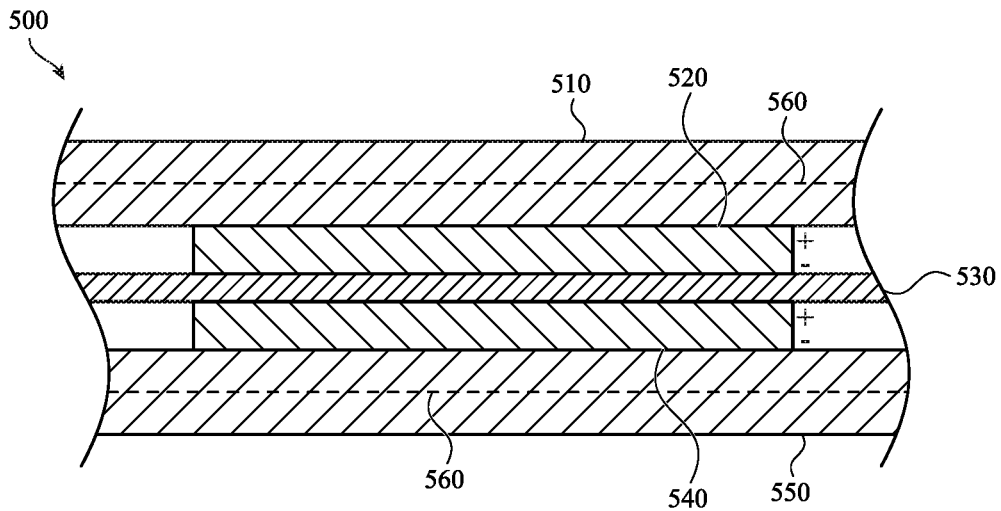
FIG. 5A illustrates another example haptic structure for use with an electronic device.
Figure 5B:
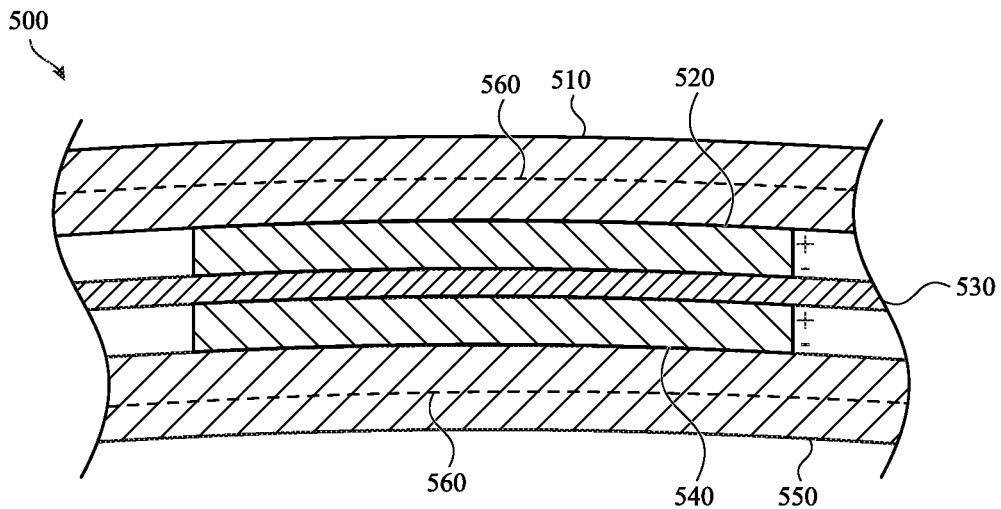
FIG. 5B illustrates the example haptic structure of FIG. 5A in a first deflected state.
Figure 5C:
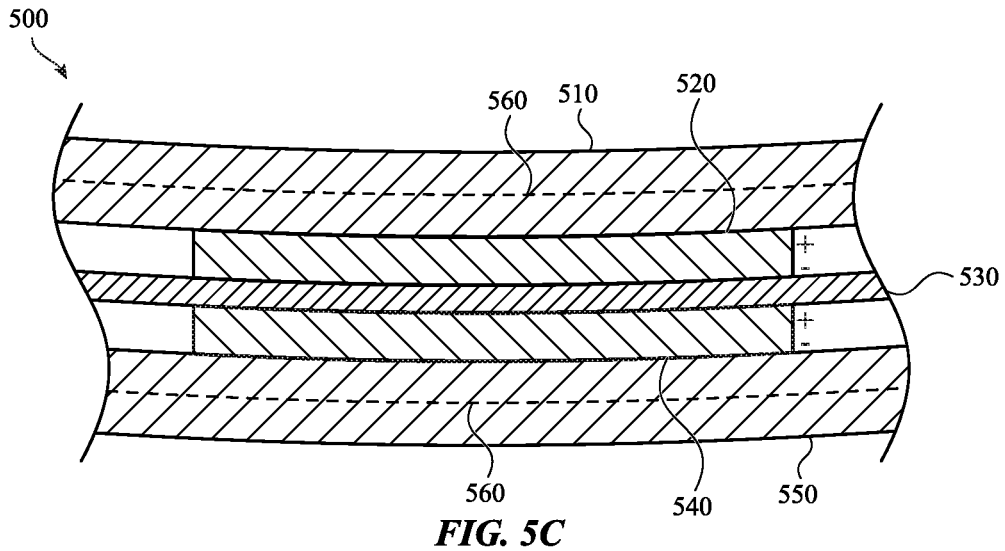
FIG. 5C illustrates the example haptic structure of FIG. 5A in a second deflected state.

In some embodiments, multiple haptic structures may be combined into a single structure such as shown in FIGS. 5A-5C. When combined in such a manner, each haptic structure may work individually or in concert depending on the type of haptic output desired.

For example, a haptic structure 500 may include a first substrate 510, a first actuator 520, a strain break 530, a second actuator 540, and a second substrate 550. The first substrate 510 is coupled to the first actuator 520. The first actuator 520 may also be coupled to the second actuator 540 via the strain break 530. The second actuator 540 may also be coupled to the second substrate 550. In some implementations, a third substrate (not shown) may be positioned between the first actuator 520 and the second actuator 540. The third substrate may also bend in response to actuation of the first actuator 520 and/or the second actuator 540 such as will be described below.

Each of the first substrate 510 and second substrate 550 may be made of the same material and may include at least one positive electrode and at least one negative electrode. In other cases, each of the substrates may be made from different materials. For example, each substrate may be glass, plastic, metal, wood, or other such material. In another embodiment, the first substrate 510 is glass and the second substrate 550 is metal.

The first actuator 520 and the second actuator 540 may be similar types of actuators. In other cases, the first actuator 520 may be a first type of actuator while the second actuator 540 is a second type of actuator.

The strain break 530 may be any type of material that allows the first actuator 520 and the second actuator 540 to expand or contract thereby deforming their respective substrates—either individually or in concert.

In some embodiments, each of the first actuator 520 and the second actuator 540 may work together to provide a haptic output. For example, when a voltage is applied to the first actuator 520, the first actuator 520 may move in a direction which causes the first substrate 510 to become convex or otherwise deflect such as shown in FIG. 5B. Likewise, the second actuator 540 may move in a direction which causes the second substrate 550 to deflect or otherwise bend in the same direction as the first substrate 510 such as shown in FIG. 5B.

In other embodiments, movement of the first actuator 520 in a direction may cause the first substrate 510 to become concave while movement of the second actuator 540 in a direction may also cause the second substrate to become concave such as shown in FIG. 5C.

Each actuator may be operated independently of one another. Thus, if a voltage is applied to the first actuator 520, which causes the first actuator 520 to contract, the entire haptic structure 500 may be deflected or otherwise bend subject to the neutral axis 560 of each substrate. Likewise, if a voltage is applied to the second actuator 540, which causes the second actuator 540 to contract, the entire haptic structure 500 may also deflect or otherwise bend. Regardless of the direction of deformation of the substrates, the haptic output may be provided on a surface of the device that integrates the haptic structure 500.

Figure 6A:
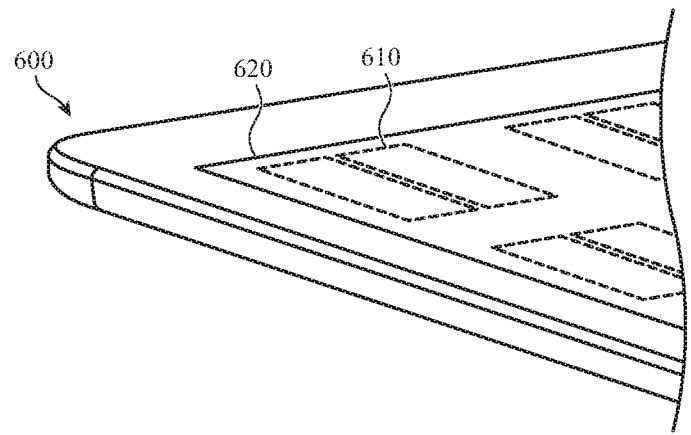
FIG. 6A illustrates an electronic device having a haptic structure coupled to a cover glass of the electronic device.
Figure 6B:
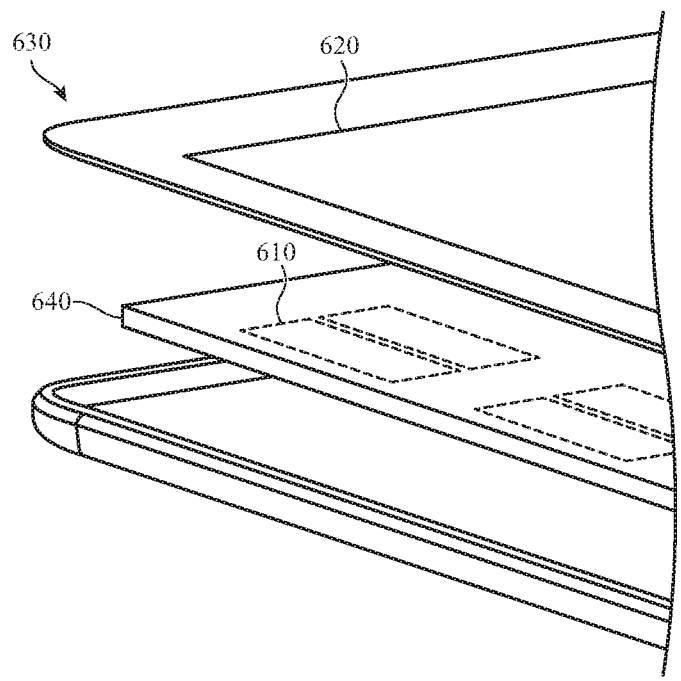
FIG. 6B illustrates an electronic device having a haptic structure coupled to a support structure of the electronic device.
Figure 6C:
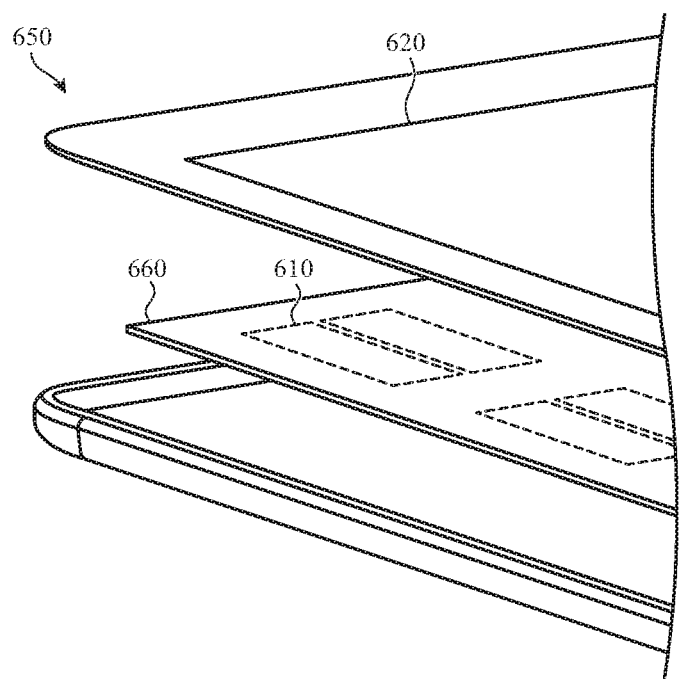
FIG. 6C illustrates an electronic device having a haptic structure coupled to a display of the electronic device.

FIGS. 6A-6C illustrate example, non-limiting configurations of one or more haptic structures 610 within an electronic device 600 according to one or more embodiments of the present disclosure. The haptic structure 610 may be similar to the haptic structures shown and described above. Likewise, the electronic device 600 may be similar to the electronic device shown and described with respect to FIGS. 1A-1C.

FIG. 6A illustrates a configuration in which the haptic structure 610 is placed on, beneath or otherwise coupled to a cover glass 620 of the electronic device 600. Thus, when a voltage or other stimulus is applied to the haptic structure 610, the haptic structure 610 moves in a first direction. In response to the haptic structure 610 moving in the first direction, the cover glass 620 moves in a second direction such as described above.

Figure 8A:
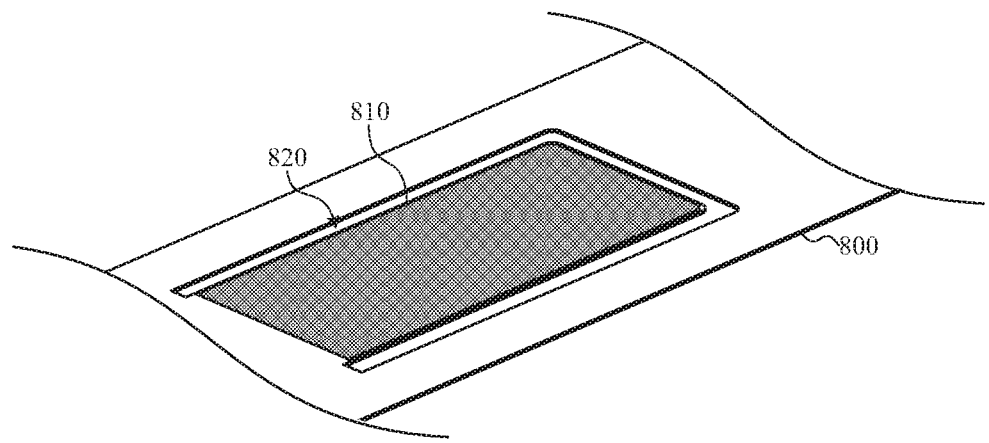
FIG. 8A illustrates a first example configuration of a substrate that may be used with a haptic structure.
Figure 8B:
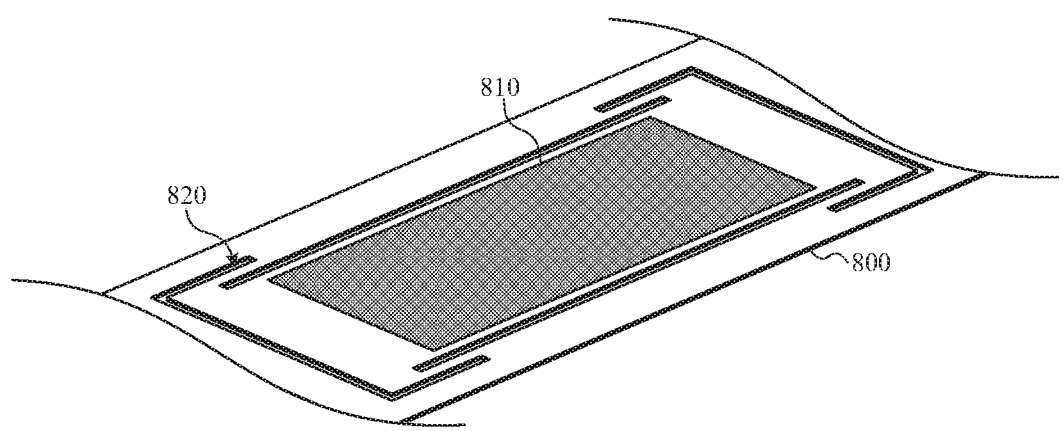
FIG. 8B illustrates a second example configuration of a substrate that may be used with a haptic structure.
Figure 8C:
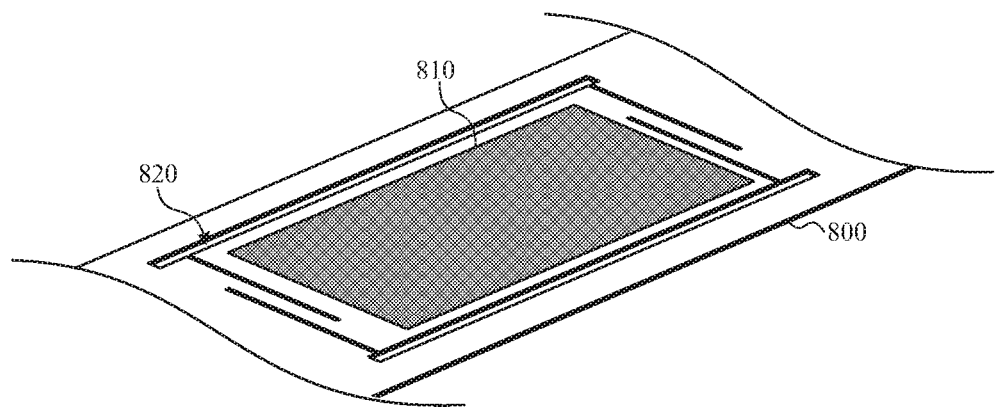
FIG. 8C illustrates a third example configuration of a substrate that may be used with a haptic structure.

The cover glass 620 may include one more channels or scribes (such as shown in FIGS. 8A-8C). These channels or scribes may be used to help localize the haptic output at a particular location (such as will be discussed below) and may also be used to connect the various haptic structures 610 together. For example, one or more traces or electrodes may be placed in the channels as the haptic structures 610 are coupled to the cover glass 620. These traces or electrodes may then be coated to prevent contaminants from entering the channels.

The channels may be formed by removing portions of the cover glass 620. As such, portions of the cover glass 620 having channels may be thinner than portions of the cover glass 620 that do not have channels. In some embodiments, the channels may define boundaries or sections of the cover glass 620. Accordingly, increased haptic output may be felt in these sections when compared with the sections that do not include the channels as the haptic structure 610 may more easily move or deflect the sections of the cover glass 620 surrounded or defined by the channels.

Because these sections of the cover glass 620 may be more easily moved, the haptic structure 610 may require less power when providing haptic output. In certain embodiments, the various components of the haptic structure 610 may be made from a transparent or translucent material. Thus, when such structures are placed on or near the cover glass 620, the haptic structures 610 do not obstruct images that are output on the display.

FIG. 6B illustrates an example electronic device 630 in which a haptic structure 610 is coupled to a support structure 640 of the electronic device 630. In some embodiments, one or more haptic structures 610 are coupled underneath the support structure 640. In other embodiments, one or more haptic structures 610 are coupled above the support structure 640. In yet other embodiments, one or more haptic structures 610 are coupled underneath the support structure 640 while one or more additional haptic structures 610 are placed on top of the support structure 640. Regardless of the positioning of the haptic structures 610, deflection or other movement of the haptic structures 610 may cause the support structure 640, and the cover glass 620, to deflect or otherwise move such as described herein.

FIG. 6C illustrates another example electronic device 650 in which haptic structures 610 are placed on, behind, or otherwise coupled to a display stack 660. The display stack 660 may be an organic light emitting diode display (OLED). In another implementation, the display stack 660 may be a light emitting diode (LED) stack with a backlight. As with the other example embodiments described, when the haptic structures 610 are actuated, the display stack 660 may deflect which causes corresponding movement on the cover glass 620 of the electronic device 650.

FIGS. 7A-7H illustrate example layouts of actuators or haptic structures 710 for providing haptic output for an electronic device 700 according to one or more embodiments of the present disclosure. The various arrangements or patterns and sizes of the haptic structures 710 shown below are examples and should not be taken in a limiting sense. The haptic structures 710 may have various shapes and sizes and may be arranged in numerous configurations. In addition, larger haptic structures 710 may be used in some locations while other smaller haptic structures 710 may be used in other locations within an electronic device 700.

Each haptic structure 710 in the following example embodiments may be driven at different times and at different locations to achieve a desired localization and haptic output. In addition, multiple haptic structures 710 may be driven at different times (or at the same time) to help ensure that haptic output remains the same or substantially the same along the entire surface of the electronic device 700. For example, various input signals may be provided to the haptic structures 710 to cause the haptic structures 710 to be driven at various times and locations such that haptic output at a first location feels the same or substantially similar to haptic output provided at a second location. In some embodiments, some haptic structures 710 may also be driven out of phase with respect to other haptic structures 710 to deaden or dampen various surface areas of the electronic device 700.

Figure 7A:
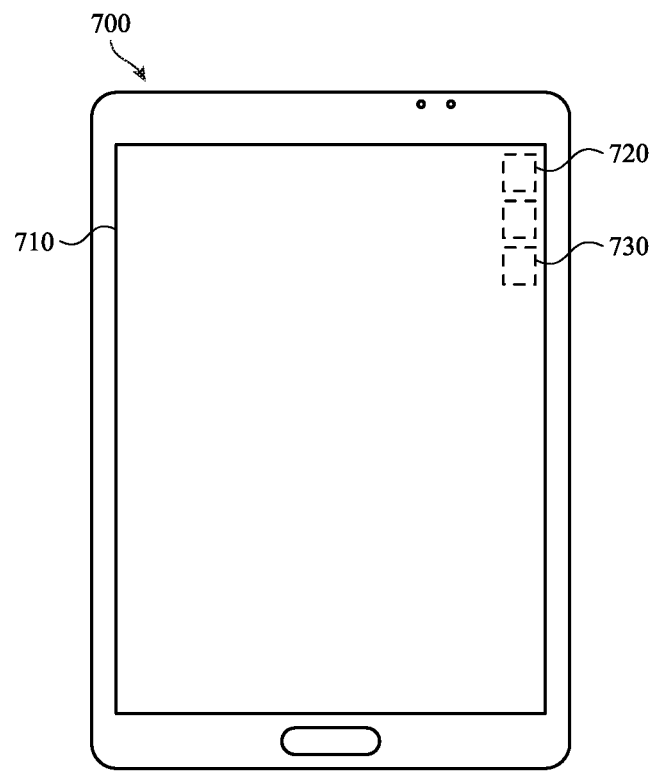
FIG. 7A illustrates a first example layout of a haptic structure that may be used to provide haptic output for an electronic device.

FIG. 7A illustrates a haptic structure 710 that consists of a single sheet that covers or substantially covers the entire surface of a cover glass, a support structure, a display, or a display stack of the electronic device 700. In some embodiments, the haptic structure 710 of FIG. 7A may include a number of discrete electrodes 720 placed at various locations on the haptic structure 710. Each electrode 720 may be activated simultaneously, substantially simultaneously, consecutively, or individually.

In some cases, edges of the cover glass of the electronic device 700 may have a boundary condition that prevents or prohibits movement of the cover glass of the electronic device 700. For example, the peripheral edges of the cover glass may be glued, coupled or otherwise secured to the housing or a support structure of the electronic device 700. In order to help ensure that the haptic output is consistent across the entire surface of the electronic device 700, multiple electrodes 720 may be driven at or near the first location (e.g., near the border of the cover glass) while fewer electrodes 720 may need to be driven in a second location (e.g., near the center of the cover glass).

In some embodiments, a first electrode 720 may be driven with a first voltage while a second electrode 730 may be driven with a second voltage. The difference in the voltage may be the result of location and/or the type of haptic output desired. In addition, an electrode 720 may be driven by a first voltage at a first time and a second voltage at a second time.

In another example, in order to localize a feel of the haptic output, a first electrode 720 may be activated at a first time at a first location while a second electrode 730 is activated at a second time and at a second location. In yet another example, a first electrode 720 may be activated at a first time and at a first location while a second electrode 730 is activated at the first time but at the second location. Activation of the second electrode 730 at the second location may enhance, offset or cancel some or all of the haptic output caused by the first electrode 720 at the first location but felt at the second location.

Figure 7B:
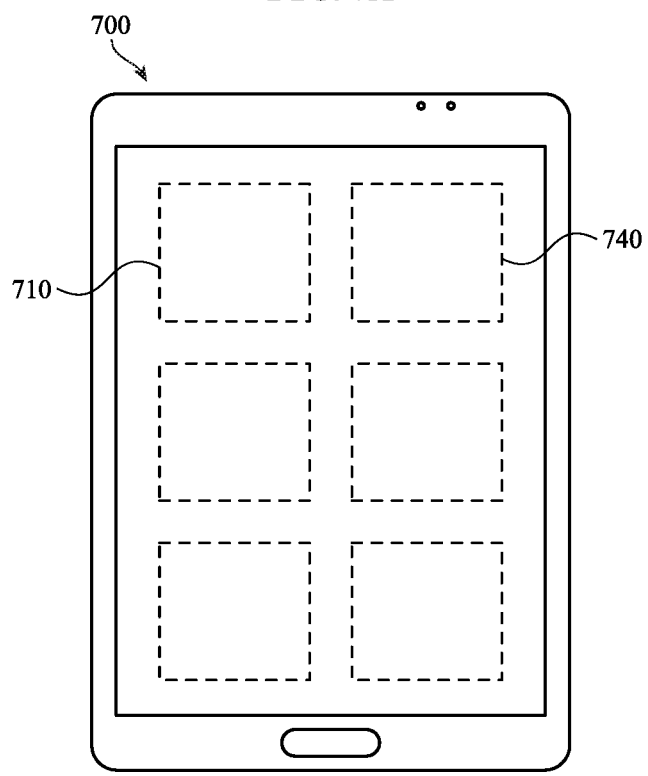
FIG. 7B illustrates a second example layout of multiple haptic structures that may be used to provide haptic output for an electronic device.

In some embodiments, an electronic device 700 may include multiple haptic structures placed at different locations such as shown in FIG. 7B. A first haptic structure 710 may be actuated to output a first waveform while a second haptic structure 740 may be actuated to output a second waveform that either enhances, cancels, or dampens the waveform output by the first haptic structure 710. In other implementations, a first waveform may be provided to the haptic structure 710 at a first time and a second waveform may be provided to the haptic structure 710 at a second time to dampen, offset, or cancel the output waveform caused by the first input waveform. Such waveforms may be used in each of the example arrangements described below.

In addition, each of the first haptic structure 710 and the second haptic structure 740 may be actuated simultaneously, substantially simultaneously, or consecutively depending on the type of haptic output that is desired. In addition, the first haptic structure 710 may be actuated at a first time and at a first location while the second haptic structure 740 may be actuated at a second time and at a second location. Activation of the second haptic structure 740 at the second location may either enhance or suppress haptic output at the first location, the second location, or combinations thereof, caused by the actuation of the first haptic structure 710.

Figure 7C:
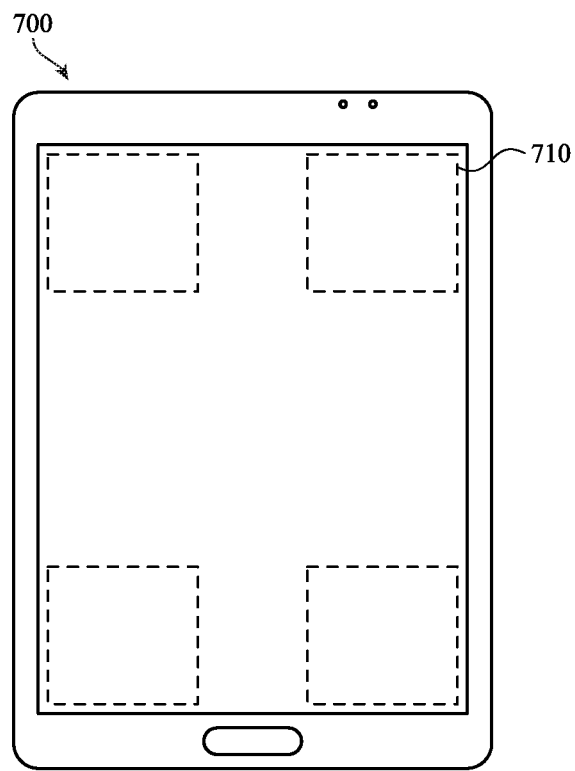
FIG. 7C illustrates a third example layout of multiple haptic structures that may be used to provide haptic output for an electronic device.

FIG. 7C illustrates another example arrangement of haptic structures 710 of an electronic device 700. As shown in FIG. 7C, the haptic structures 710 may be placed at various corners of the electronic device 700. As with the example embodiments described herein, when touch is applied to a particular location, one or more of the haptic structures 710 provide haptic output at the location where touch is detected.

In some embodiments, one or more of the haptic structures 710 may have different sizes or dimensions. The differing sizes of haptic structures 710 may be placed at particular locations in order to provide consistent haptic output across the entire surface of the electronic device 700. For example, a large haptic structure 710 may provide a more pronounced haptic output than a small haptic structure 710. As such, the larger haptic structure 710 may be located near the border of the cover glass of the electronic device 700 as there may be more restrictions to movement of the cover glass at these locations. Likewise, a smaller haptic structure 710 may be placed near the center of the cover glass.

Figure 7D:
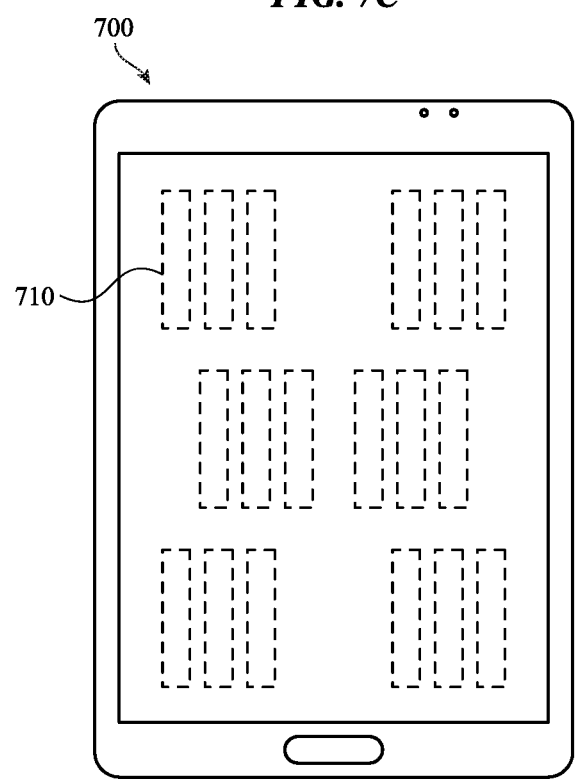
FIG. 7D illustrates a fourth example layout of multiple haptic structures that may be used to provide haptic output for an electronic device.

FIG. 7D illustrates an array of haptic actuators or haptic structures 710 positioned at various locations on a surface of the electronic device 700. As described above, single haptic structure 710 may include one or more actuators. The actuators may be formed in an array. Thus, each actuator in the array of actuators may be driven at various times with different input signals. Additionally, various haptic structures 710 may be arranged in an array. In this implementation, each haptic structure 710 may be driven at different times with different input signals in order to provide a desired haptic output.

Figure 7E:
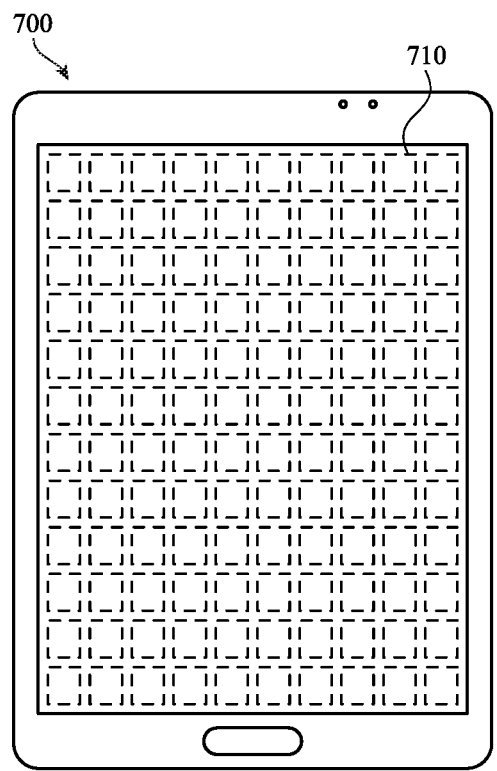
FIG. 7E illustrates a fifth example layout of multiple haptic structures that may be used to provide haptic output for an electronic device.
Figure 7F:
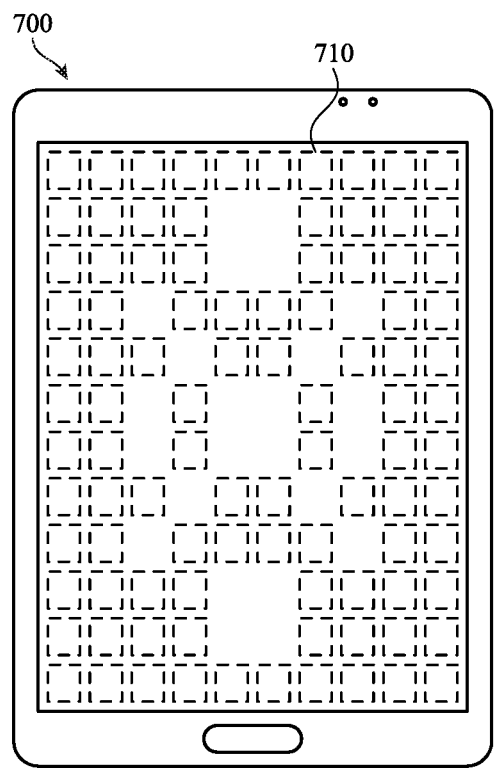
FIG. 7F illustrates a sixth example layout of multiple haptic structures that may be used to provide haptic output for an electronic device.

FIGS. 7E-7H illustrate additional example arrangements of haptic structures 710 that may be used according to various embodiments. For example, and as shown in FIG. 7E, the electronic device 700 includes a number of haptic structures 710 placed on the entire cover glass or display of an electronic device 700. In the embodiments shown in FIG. 7F, fewer haptic structures 710 may be placed in the center of the cover glass because less force may be required to deflect the cover glass at that location when compared to the force required to move or deflect the cover glass near the edge.

Figure 7G:
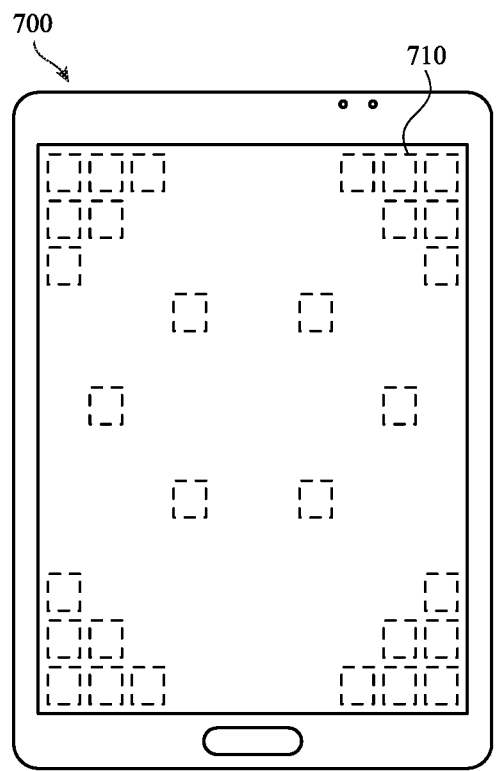
FIG. 7G illustrates a seventh example layout of multiple haptic structures that may be used to provide haptic output for an electronic device.
Figure 7H:
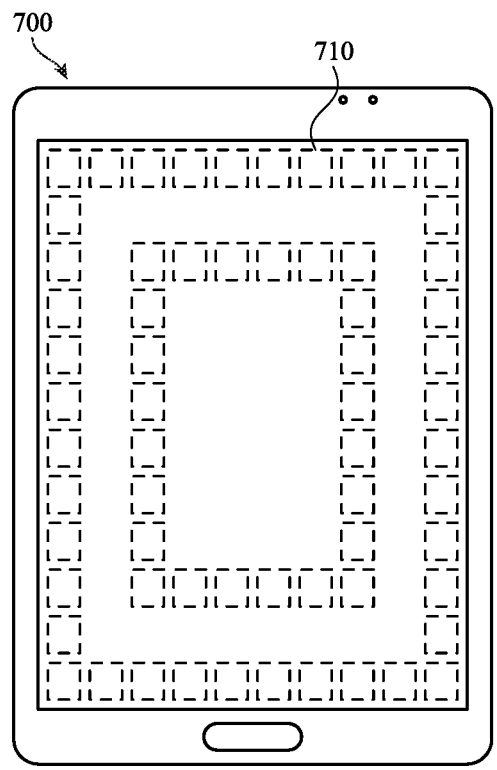
FIG. 7H illustrates an eighth example layout of multiple haptic structures that may be used to provide haptic output for an electronic device.

Likewise, FIG. 7G illustrates another example arrangement in which more haptic structures 710 are placed near a boundary of the cover glass than in the center of the cover glass to account for a boundary condition that may be present. FIG. 7H illustrates yet another example arrangement of haptic structures 710 in which the haptic structures 710 surround a border or periphery of the cover glass.

In each of the embodiments shown and described above, the substrate or cover glass may include one or more channels or scribes that help localize areas on the substrate such as described above. Further, although rectangular or square haptic structures are shown and described, the haptic structures 710 may be in any suitable shape or size.

FIGS. 8A-8C illustrate example configurations of a substrate 800 on which an actuator 810 may be coupled according to one or more embodiments of the present disclosure. An actuator 810 may be part of a haptic structure such as described above or may be equivalent to the haptic structures described above.

As shown in these figures, the substrate 800 may include one or more channels 820, grooves, scribes and so on that enable the actuator 810 to more easily move or deflect the substrate 800. The channels 820 may be extend entirely though the substrate 800 or may extend partially through the substrate 800.

For example, the substrate 800 is thinner in the areas that have channels 820. Because the area with the channels 820 is thinner, it is easier for these areas to bend or move. As a result, the actuator 810 may use less power to move these areas than would otherwise be required. In addition, the channels 820 may help localize the haptic output to an area surrounded by the channel 820. For example, the channels 820 may form a release for the substrate 800. Thus, when the actuator 810 is driven, movement is localized at the released portion of the substrate 800.

As also shown in FIGS. 8A-8C the channels 820 may be arranged in various configurations and designs. In some embodiments, the channels 820 may be formed in a cover glass or other such surface in the electronic device. In other embodiments, the substrate 800 may include the channels 820 and be coupled to the cover glass or other surface of the electronic device.

Figure 9:
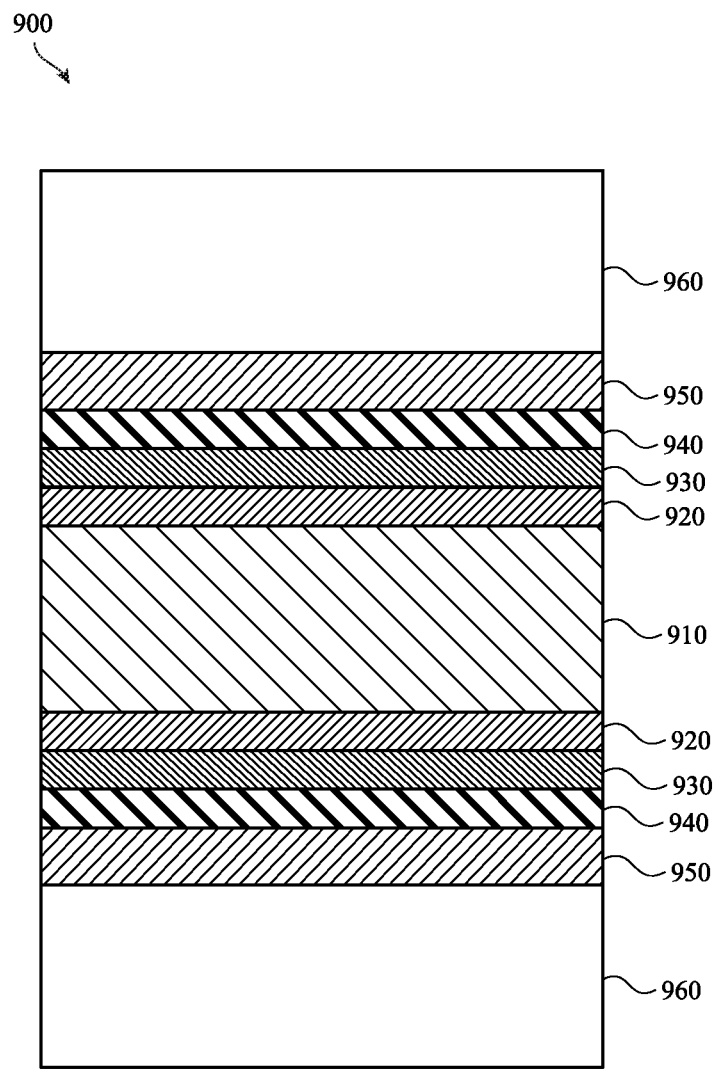
FIG. 9 illustrates an example actuator stack.

FIG. 9 illustrates an example haptic structure 900 according to one or more embodiments of the present disclosure. The haptic structure 900 may include or may be used as one of the piezoelectric materials or the piezoelectric actuator such as described above.

As shown in FIG. 9, the haptic structure 900 may include a piezoelectric material 910 disposed in the center of the haptic structure 900. An alloy 920, such as, for example, a nickel based alloy, may be coupled on either side of the piezoelectric material 910. A silver layer 930 may then be placed over the alloy 920 to assist in creating the conductive path of the haptic structure 900.

An epoxy layer 940 may then be placed on the haptic structure 900. The epoxy layer 940 may be used to couple an electrode 950 (e.g., a silver electrode) to the haptic structure 900 such as shown. In some embodiments, a first electrode 950 in the haptic structure 900 may be a positive electrode while a second electrode 950 in the haptic structure 900 may be a negative electrode. Although not required, the epoxy layer 940 may be used to fill in the gaps between the various components of the haptic structure 900 and may also be used to smooth the various surfaces of the haptic structure 900. A substrate 960 may then be coupled to the electrodes 950 as shown.

The substrate 960 may be coupled to, or integrated with, one or more components of the electronic device. For example, the substrate 960 may be coupled to or integrated with a display or a display stack of an electronic device. Thus, actuation of the haptic structure 900 causes the substrate 960 to deflect, which causes the display stack to deflect, which causes the cover glass to deflect. The deflection of the cover glass may be felt or perceived by a user.

Figure 10:
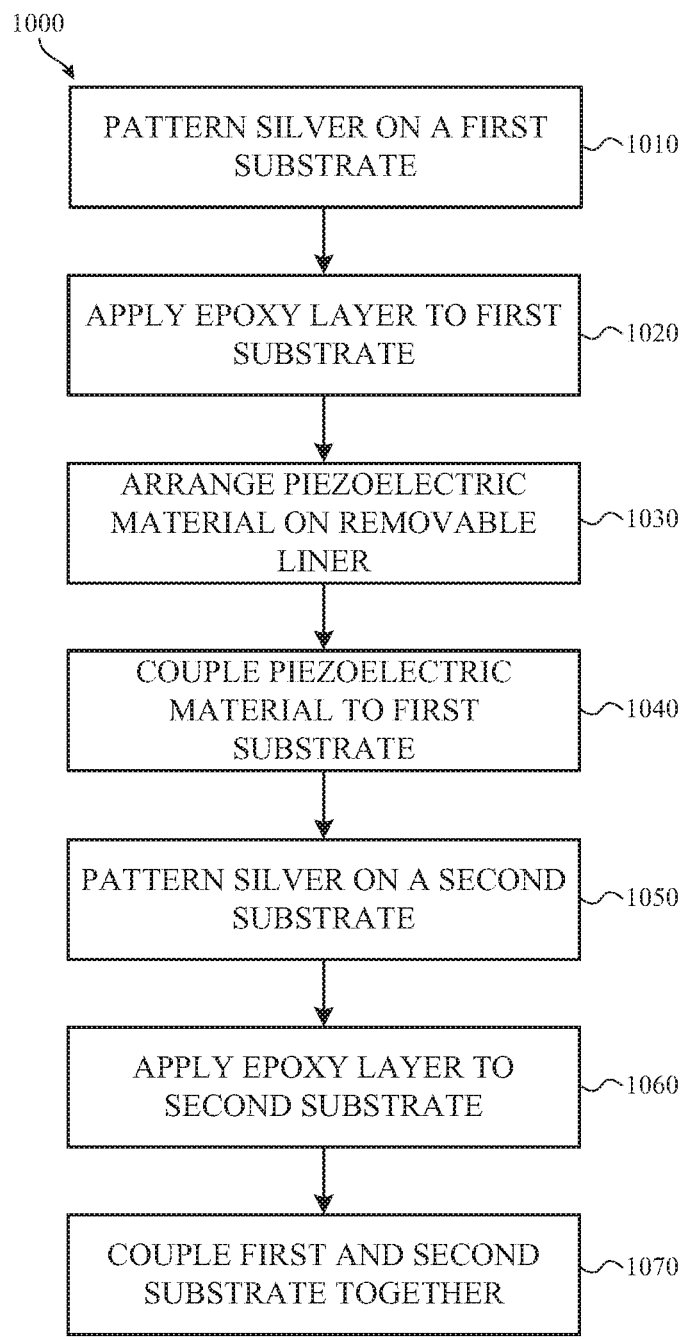
FIG. 10 illustrates a method for manufacturing an actuator or an array of actuators that may be used with an actuator stack.

FIG. 10 illustrates a method 1000 for manufacturing a haptic structure according to one or more embodiments of the present disclosure. The method 1000 may be used to manufacture the haptic structure 900 shown and described above with respect to FIG. 9. In other cases, the method 1000 may be used to manufacture the various other haptic structures described herein.

Method 1000 begins at operation 1010 in which silver is patterned on a substrate to create an electrode of the haptic structure. In some embodiments, the electrode may be a positive electrode or a negative electrode. The substrate may be glass, plastic, metal, cloth, wood, or other such material.

Flow then proceeds to operation 1020 in which an epoxy layer is applied to the substrate and the patterned silver. Once the epoxy has been applied to the substrate, one or more piezoelectric materials or electroactive polymers are arranged 1030 on a removable liner.

In instances in which a piezoelectric material is used, the piezoelectric material may include a layer of piezoelectric material coupled to an alloy layer and a silver layer such as shown in FIG. 9. The piezoelectric material is then coupled 1040 to the substrate. Once the piezoelectric material is coupled to the substrate, the removable liner may be removed to expose at least one side of the piezoelectric material.

The method 1000 continues by preparing a second side of the haptic structure. More specifically once the operations described above have been performed, a second substrate is obtained and silver is patterned 1050 on the second substrate. The silver on the second substrate may be used as a second electrode in the haptic structure. The second electrode can be a positive electrode or a negative electrode so long as the haptic structure has at least one positive electrode and at least one negative electrode.

The process continues by applying 1060 a layer of epoxy to the first structure and the second structure and the two layers are coupled together 1070 to create a haptic structure. In some embodiments, the layer of epoxy may be used to fill gaps that may be present between the other layers of the haptic structure. In addition, the thickness of each of the first substrate and the second substrate may be the same, substantially similar, or different.

Figure 11:
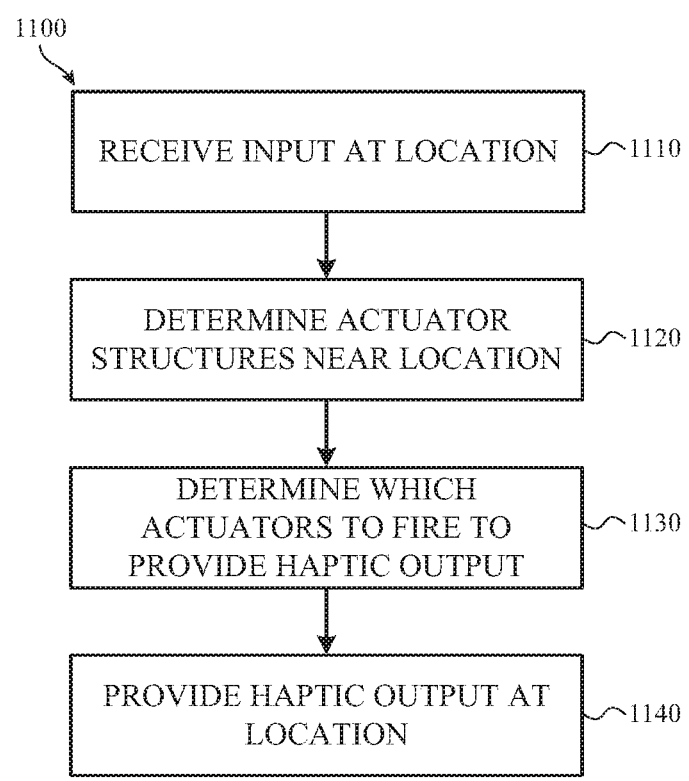
FIG. 11 illustrates an example method for providing haptic output.

FIG. 11 illustrates an example method 1100 for providing haptic output on an electronic device according to one or more embodiments of the present disclosure. In some embodiments, the method 1100 may be used to provide haptic output on various electronic devices such as described herein.

Method 1100 begins at operation 1110 in which input is received at a first location. In some embodiments, the input may be touch input, force input, or a combination thereof.

In response to receiving the input, a determination 1120 is made as to which actuator, haptic structure or electrode should be driven in order to provide the haptic output at the determined location. For example and as described above, because the electronic device may include various haptic structures, electrodes and/or actuators, each of which may be configured to provide haptic output, it may be necessary to determine which actuator, haptic structure and/or electrode should be driven to provide localized haptic output at the given location.

In addition to the above, it may be necessary to determine a frequency at which the drive signal is provided to the haptic structure. Further, it may be necessary to determine 1130 whether one or more actuators should be driven, both in and out of phase, to dampen, cancel or enhance movement of a substrate that is actuated by the haptic structure.

Flow then proceeds to operation 1140 and haptic output is provided at the determined location.

Figure 12:
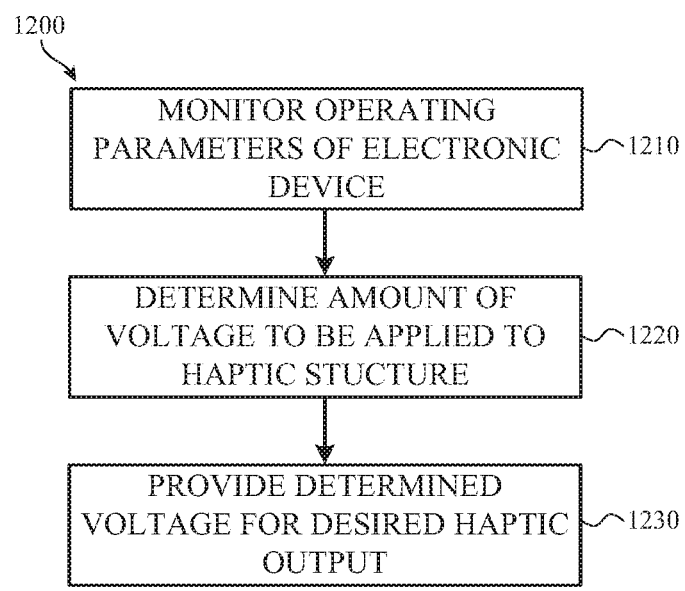
FIG. 12 illustrates a method for monitoring one or more operating parameters of an electronic device.

FIG. 12 illustrates a method 1200 for monitoring one or more operating parameters of an electronic device that incorporates a haptic structure according to one or more embodiments of the present disclosure. The method 1200 may be used as part of a closed loop control system or module that monitors various operating parameters of the electronic device. Using a closed loop system such as described enables the haptic structure to provide similar or substantially similar haptic output on the electronic device regardless of the operating environment of the electronic device.

In one example, the temperature of the electronic device, or the ambient temperature of the environment in which the electronic device operates, may affect the amount of expansion or contraction of the piezoelectric material of the haptic structure. This may ultimately affect the deflection amount or distance of the haptic structure. Accordingly, when the electronic device operates in higher temperatures, more voltage may need to be applied to the piezoelectric material to achieve a desired deflection amount when compared to when the electronic device operates in environments having lower temperatures.

Accordingly, method 1200 begins at operation 1210 in which one or more operating parameters of the electronic device is monitored. In some embodiments, the monitored operating parameters may be temperature such as described above. Flow then proceeds to operation 1220 in which an amount of voltage that is to be applied to the haptic structure is determined. This determination may be based, at least in part, on the monitored operating parameters.

Flow then proceeds to operation 1230 and the determined amount of voltage is applied to the haptic structure. The haptic structure then provides the desired or expected haptic output to a surface of the electronic device.

As discussed above, an electronic device, such as electronic device 100 (shown in FIGS. 1A-1C), may include a force-sensing element that determines an amount of force provided on a surface of the electronic device. The force-sensing element may include two or more capacitive-sensing components. In some embodiments, the capacitive-sensing components may detect a change in capacitance as a distance between the capacitive-sensing components changes. In another embodiment, at least one capacitive-sensing component may detect a change in capacitance as a distance between a component of the electronic device (e.g., a cover glass of the electronic device) and the capacitive-sensing component changes. The change in capacitance may then be used to determine the amount of force provided on the surface of the electronic device.

As also discussed above, the electronic device may also include a haptic structure. The haptic structure may be used to provide a haptic output on a surface of the electronic device. Accordingly, the embodiments described below with respect to FIGS. 13-20 illustrate various configurations by which a computing device can integrate a haptic structure and a force-sensing element.

Figure 13:
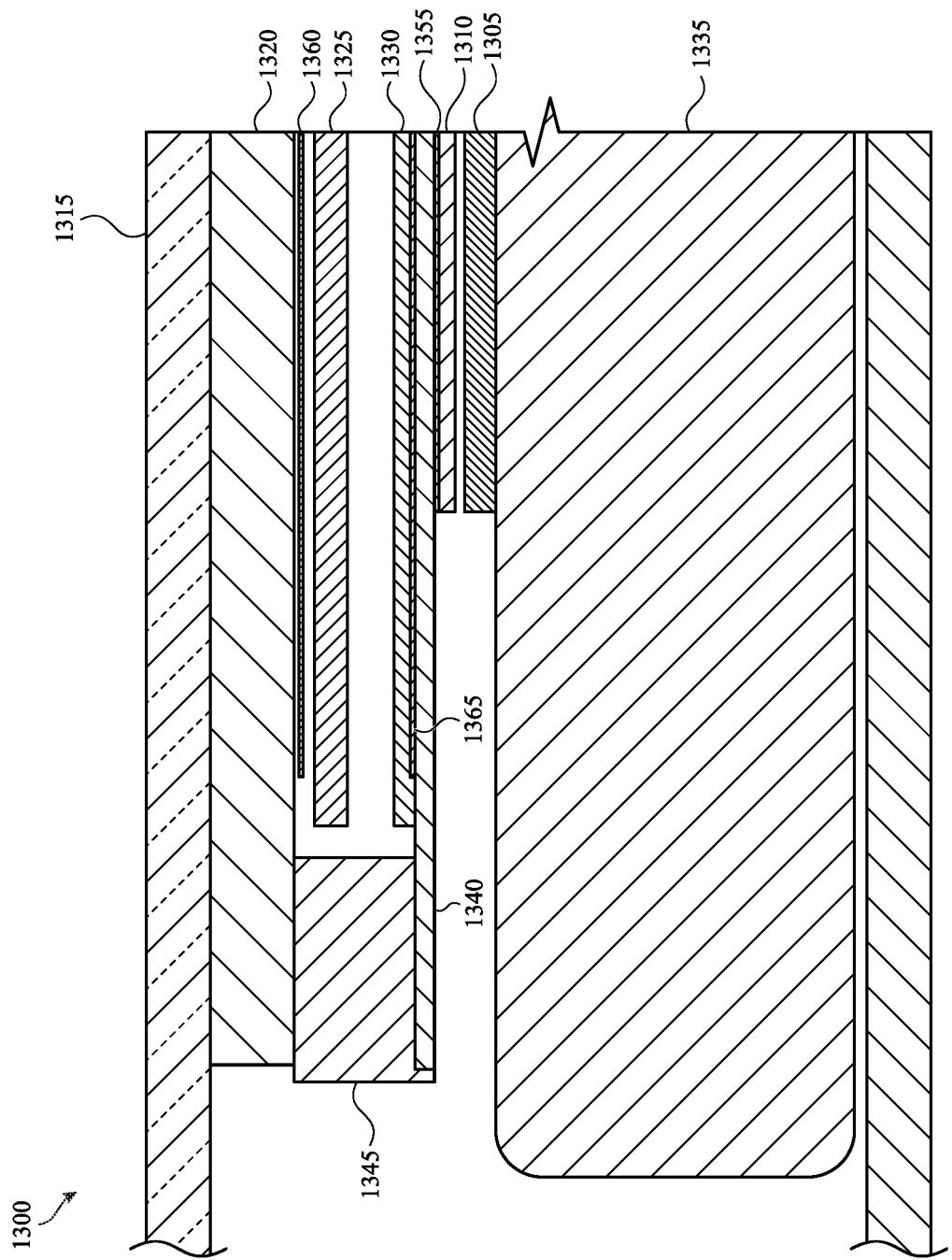
FIG. 13 illustrates a cross-section view of an example electronic device that incorporates a force-sensing element, a haptic structure and other components arranged in a first configuration.

FIG. 13 illustrates a cross-section view of an example electronic device 1300 that incorporates a force-sensing element 1305, a haptic structure 1310, and other components arranged in a first configuration. The electronic device 1300 may be similar to the electronic device 100 shown in and described above with respect to FIGS. 1A-1C. As such, the cross-section shown in FIG. 13, as well as the cross-sections shown in FIGS. 14-19, may be taken along line A-A of FIG. 1A. In addition, FIGS. 13-19 may illustrate similar components arranged in different configurations. Accordingly, like reference numerals are used throughout FIGS. 13-19.

The electronic device 1300 may include a cover glass 1315 positioned over a display 1320. The display 1320 may also include a backlight assembly 1325 and a reflector 1330. The backlight assembly 1325 and the reflector 1330, along with the display 1320, are used to output images, such as graphics and text, for the electronic device 1300. The display 1320 may be implemented as any suitable technology, including a liquid crystal display, light emitting diode display, organic light emitting diode display, cold cathode fluorescent lamp display, and so on. In some implementations, the backlight assembly 1325 may be omitted.

Although various gaps are shown between the display 1320, the backlight assembly 1325, and the reflector 1330, these gaps are not required. For example, the display 1320, the backlight assembly 1325, and the reflector 1330 may be positioned to reduce or minimize the gaps. In another embodiment, various films, adhesives, materials, or substrates may be placed between the various layers to fill any gaps.

The electronic device 1300 may also include a battery 1335. The battery 1335 provides power to the various components of the electronic device 1300. As shown in FIG. 13, the force-sensing element 1305 and the haptic structure 1310 may be positioned between the display 1320 and the battery 1335, although this is not required.

As also shown in FIG. 13, the electronic device 1300 includes a first support structure 1340 and a second support structure 1345. The first support structure 1340 may be made from a conductive material (e.g., metal) or a non-conductive material (e.g., plastic). Likewise, the second support structure 1345 may be made from a conductive material or a non-conductive material. In one embodiment, if the first support structure 1340 is made from a conductive material, the second support structure 1345 may be made from a non-conductive material. Likewise, if the first support structure 1340 is made from a non-conductive material, the second support structure 1345 may be made from a conductive material. In yet another implementation, each of the first support structure 1340 and the second support structure 1345 may be made from the same materials (e.g., metal, plastic or other such materials) and have the same conductive or non-conductive properties.

In the embodiment shown in FIG. 13, the first support structure 1340 is coupled to the second support structure 1345 and extends along a length of the display 1320. In this implementation, the first support structure 1340 may be used to dissipate heat generated by the display 1320 and other components of the electronic device.

In some implementations, the haptic structure 1310 may be coupled, using an adhesive such as an epoxy 1355, to a surface of the first support structure 1340. For example and as shown in FIG. 13, the haptic structure 1310 is coupled to a bottom surface of the first support structure 1340. However, in other implementations, the haptic structure 1310 may be coupled to a top surface and/or a side of the first support structure 1340. In yet other implementations, more than one haptic structure 1310 may be coupled to the top surface and/or the bottom surface of the first support structure 1340. As the haptic structure 1310 is coupled to the first support structure 1340, deflection or other movement of the haptic structure 1310 may cause the first support structure 1340 (and the cover glass 1315) to deflect or otherwise move such as described herein.

The force-sensing element 1305 may be used to detect an amount of force that is provided on the cover glass 1315 of the electronic device 1300. For example, as the cover glass 1315 deflects in response to a received amount of force, the force-sensing element 1305 may be operative to detect the deflection of the cover glass 1315 and equate the deflection distance with an amount of force. Accordingly, the force-sensing element 1305 may detect force across a continuous range of values and is not limited to binary values.

In some embodiments, the force-sensing element 1305 may be used to detect a change in distance from the back of the cover glass 1315 (or back of the display 1320) to the top of the force-sensing element 1305. The force-sensing element 1305 may also work in conjunction with another force-sensing device that is also operative to determine an amount of force received on the cover glass 1315.

For example, the electronic device 1300 may include a first force-sensing component 1360 and a second force sensing component 1365. In other implementations, the electronic device 1300 may only include the first force-sensing component 1360 while the second force-sensing component 1365 is omitted. In some cases, the inclusion or omission of the second force-sensing component 1365 may be based, at least in part, on the size of a gap between the force-sensing element 1305 and the haptic structure 1310 and/or the size of a gap between the force-sensing components.

In some implementations, the first force-sensing component 1360 and the second force-sensing component 1365 are capacitive electrode arrays although this is not required. The first force-sensing component 1360 and the second force-sensing component 1365 work in conjunction with the force-sensing element 1305 to determine the amount of force provided on the cover glass 1315.

More specifically, the first force-sensing component 1360 may be coupled to a back surface of the display 1320 and the second force-sensing component 1365 may be coupled to the first support structure 1340. As the cover glass 1315 and the display 1320 bend in response to a received force, the capacitance between the first force-sensing component 1360 and the second force-sensing component 1365 changes. The change in capacitance is equivalent to an amount of deflection or movement of the cover glass 1315 and/or the display 1320.

The first force-sensing component 1360 and the second force-sensing component 1365 may measure a change in capacitance between the display 1320 and the first support structure 1340, while the force-sensing element 1305 may measure a change in capacitance between the first support structure 1340 and a top surface of the force-sensing element 1305. The force-sensing element 1305 may also measure a change in capacitance between a top surface of the force-sensing element 1305 and a bottom surface of the force-sensing element 1305.

When the second force-sensing component 1365 is omitted, the first support structure 1340 may be non-conductive and/or an aperture may be provided in the first support structure 1340. The aperture may be provided above or otherwise adjacent the force-sensing element 1305 which may enable the top surface of the force-sensing element 1305 to sense capacitance and/or a change in capacitance from its bottom surface up to the display 1320. However, when the second force-sensing component 1365 is present the aperture may be omitted and/or the first support structure 1340 may be made from a conductive material.

In some embodiments, and as briefly described above, the haptic structure 1310, the first force-sensing component 1360, the second force-sensing component 1365 and/or the force-sensing element 1305 may work together to enhance a user's experience. In one non-limiting example, the haptic structure 1310 may provide haptic or tactile output in response to a received amount of force.

In a more specific example, when the force-sensing element 1305 detects a received amount of force, or when a received amount of force exceeds a force threshold, the haptic structure 1310 may be actuated. When the haptic structure 1310 is actuated, the haptic structure 1310 deforms or deflects. Deflection of the haptic structure 1310 causes a midplate (or other structure (e.g., the reflector 1330) to which the haptic structure 1310 is coupled) to also deform. This actuation and deformation may also cause the cover glass 1315 to deform due to the coupling between the haptic structure 1310, the reflector 1330, and one or more of the first support structure 1340 and the second support structure 1345. Deformation of the cover glass 1315 may be felt or otherwise perceived by an individual or object touching the cover glass 1315. In some implementations, the haptic structure 1310 may provide a first type of haptic output or a haptic output at a first location in response to a first amount of detected force, and may provide a second type of haptic output or a haptic output at a second location in response to a second amount of detected force.

In addition to the above, the haptic structure 1310, the first force-sensing component 1360, the second force-sensing component 1365, and/or the force-sensing element 1305 may also work in conjunction to determine a location of a received touch input and/or force input. When such a location is determined, actuation of the haptic structure 1310 and any associated haptic output may be localized at the determined position.

In another implementation, the haptic structure 1310 may provide haptic output in an area surrounding or adjacent the determined location. To achieve this, one or more haptic structures 1310, or portions of the haptic structure 1310, may be actuated at different times and at different locations to effectively cancel out (or alternatively enhance) the haptic output provided by the haptic structure 1310 such as described above.

In still yet other implementations, the electronic device 1300, as well as the other example electronic devices described herein, may include multiple haptic structures 1310 positioned on different layers. In another implementation, the haptic structure 1310 itself may include different layers. In these example implementations, the layers may be inverted with respect to one another. For example, a first layer or a first haptic structure 1310 may be operative to deflect or deform in a first direction or in a first manner while a second layer or a second haptic structure 1310 may be operative to deflect or deform in a second direction or in a second manner.

In some embodiments, the haptic structure 1310 may be comprised of a single layer with alternating haptic elements. For example, a first haptic element may cause the haptic structure 1310 to deflect in a first direction or in a first manner while a second haptic element may cause the haptic structure 1310 to deflect in a second direction or in a second manner that is opposite from the first direction or the first manner.

Although the haptic structure 1310, the first force-sensing component 1360, the second force-sensing component 1365, and the force-sensing element 1305 are shown as separate components, this is not required. In some embodiments, the haptic structure 1310 (or a haptic actuator of the haptic structure 1310) may be combined with one or more of the first force-sensing component 1360, the second force-sensing component 1365, and/or the force-sensing element 1305.

The combination of components may minimize gaps or other space that may be present between the various components may which result in a force accuracy error and may also change haptic output such as described herein.

For example, the force-sensing element 1305 may include a piezoelectric material that provides an output voltage when it is actuated in response to a received force. The output voltage is then used to determine an amount of force provided. This same piezoelectric material may then be actuated in the manner described above to produce a haptic output in response to the received force.

Figure 14:
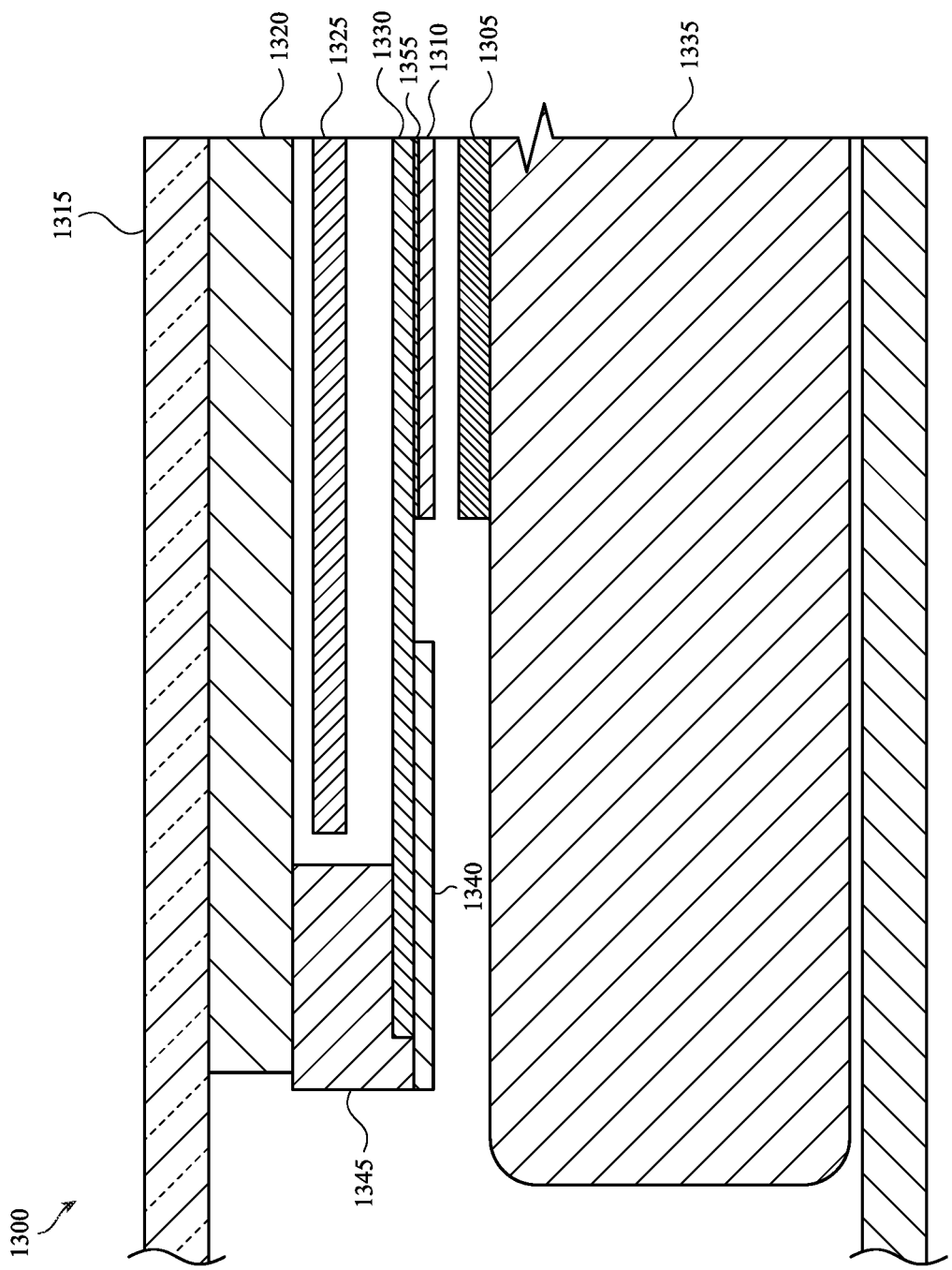
FIG. 14 illustrates a cross-section view of an example electronic device that incorporates a force-sensing element, a haptic structure and other components arranged in a second configuration.

FIG. 14 illustrates a cross-section view of an example electronic device 1300 in which the force-sensing element 1305, the haptic structure 1310, and the other components of the electronic device 1300 are arranged in a second configuration. In the embodiment illustrated in FIG. 14, the electronic device 1300 includes similar components to those described above. For example, the electronic device 1300 includes a force-sensing element 1305, a haptic structure 1310, a cover glass 1315, a display 1320, a backlight assembly 1325, a reflector 1330 and a battery 1335.

The electronic device 1300 also includes a first support structure 1340 and a second support structure 1345. However, unlike the first support structure 1340 in FIG. 13, the first support structure 1340 in FIG. 14 is positioned adjacent the haptic structure 1310. Another difference, although not required, is that the first force-sensing component 1360 and the second force-sensing component 1365 may be omitted. More specifically, the force-sensing element 1305 may be configured to detect a change in capacitance between the display 1320 and the top surface of the force-sensing element 1305. As with all of the embodiments described herein, the force-sensing element 1305 may also detect a capacitance or a change in capacitance between its top surface and its bottom surface. In some embodiments, these measurements may be combined (or used individually) to detect or otherwise predict the total amount of received force.

As previously described, the haptic structure 1310 provides haptic output by causing a substrate or other such component in the electronic device 1300 to deflect. Therefore, in some embodiments, the haptic structure 1310 may be coupled to the reflector 1330.

More specifically, and as shown in FIG. 14, the haptic structure 1310 may be coupled to a back surface of the reflector 1330 using an epoxy 1355 or a pressure sensitive adhesive. The top side of the reflector 1330 may be layered or otherwise covered with a reflective material. Thus, the reflector 1330 may function as a bottom layer of the backlight assembly 1325 and also assists the haptic structure 1310 in providing haptic output.

For example, and as discussed above, as the haptic structure 1310 deflects or deforms, the reflector 1330 deflects or deforms. Deflection of the reflector 1330 causes the display 1320 and/or the cover glass 1315 to deflect, via the second support structure 1345, which provides haptic output such as previously described.

Figure 15:
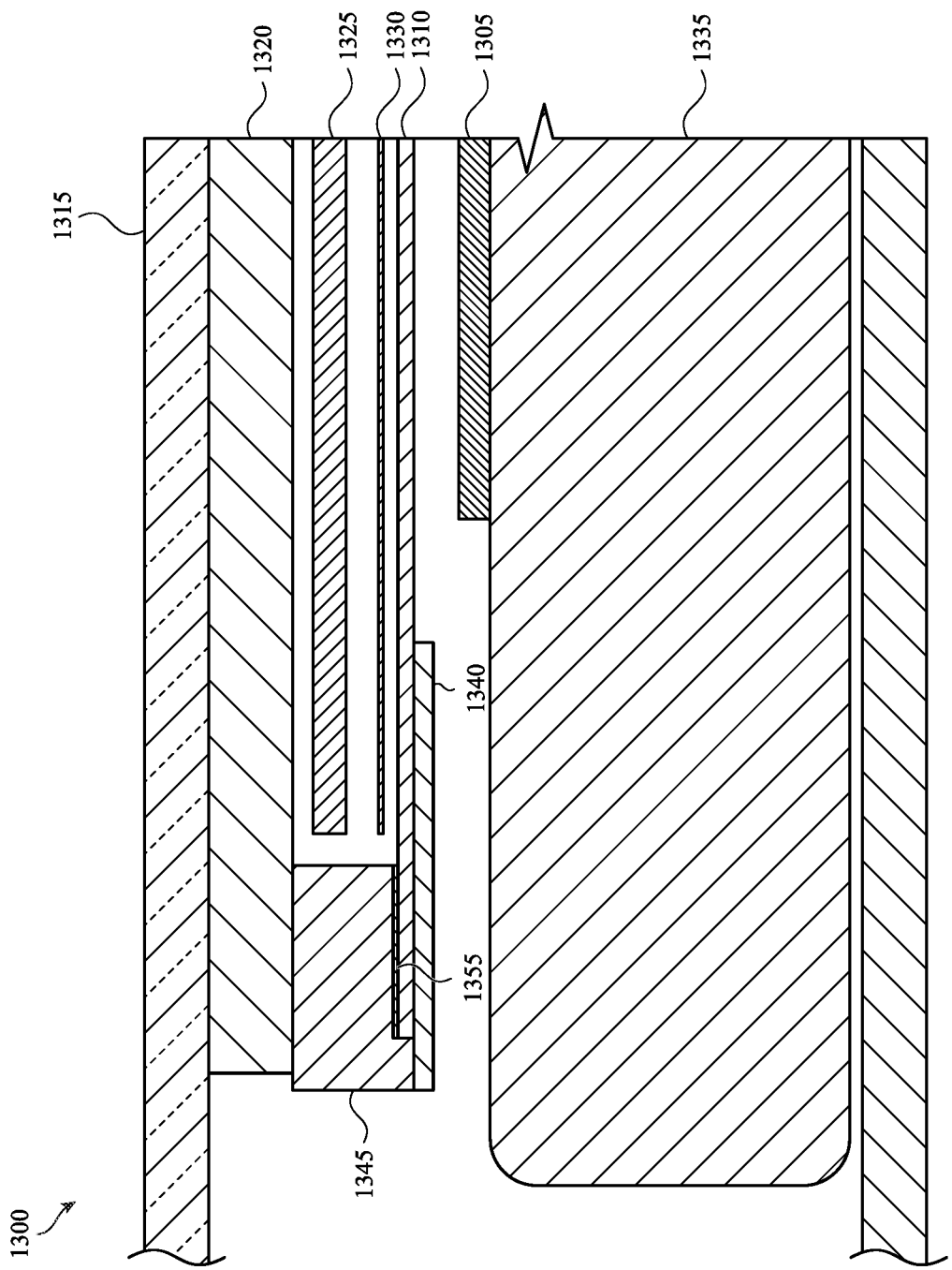
FIG. 15 illustrates a cross-section view of an example electronic device that incorporates a force-sensing element, a haptic structure and other components arranged in a third configuration.

FIG. 15 illustrates a cross-section view of an example electronic device 1300 in which the force-sensing element 1305, the haptic structure 1310, and the other components of the electronic device 1300 are arranged in a third configuration. In the configuration shown in FIG. 15, the electronic device 1300 may include similar components as those described above with respect to FIG. 14. Namely, and in addition to the force-sensing element 1305 and the haptic structure 1310, the electronic device 1300 includes a cover glass 1315, a display 1320, a backlight assembly 1325, a reflector 1330 and a battery 1335.

In the arrangement shown in FIG. 15, the haptic structure 1310 is essentially a floating sheet. For example, only peripheral edges of the haptic structure 1310 are coupled to the first support structure 1340 and the second support structure 1345. The coupling of the components may be accomplished using an epoxy 1355 or a pressure sensitive adhesive.

In order to provide haptic output such as described above, the haptic structure 1310 may include a thick substrate. For example, and referring to FIG. 9, the haptic structure includes, among other components, two different substrates, namely a top substrate and a bottom substrate. In this example embodiment, one of the substrates of the haptic structure 1310, such as for example, the top substrate, may be thicker than the bottom substrate.

As the top substrate (or the bottom substrate) is thicker in this embodiment than in the embodiments described previously, the haptic structure 1310 provides its own deflection surface. For example, as the piezoelectric elements of the haptic structure 1310 are actuated, the top substrate of the haptic structure 1310 deflects. Deflection of the top substrate also causes deflection of the display 1320 and the cover glass 1315 such as previously described.

In order to reduce or minimize impact on the overall thickness of the electronic device 1300, the reflector 1330 may be thinner than in the previously described embodiments. Thus, in order to offset the increased thickness of the top substrate of the haptic structure 1310, the thickness of the reflector 1330 may be reduced. Although the reflector 1330 is specifically mentioned, the thicknesses of other components of the electronic device 1300 may also be reduced, either alone or in combination, to offset the increased thickness of the haptic structure 1310.

Figure 16:
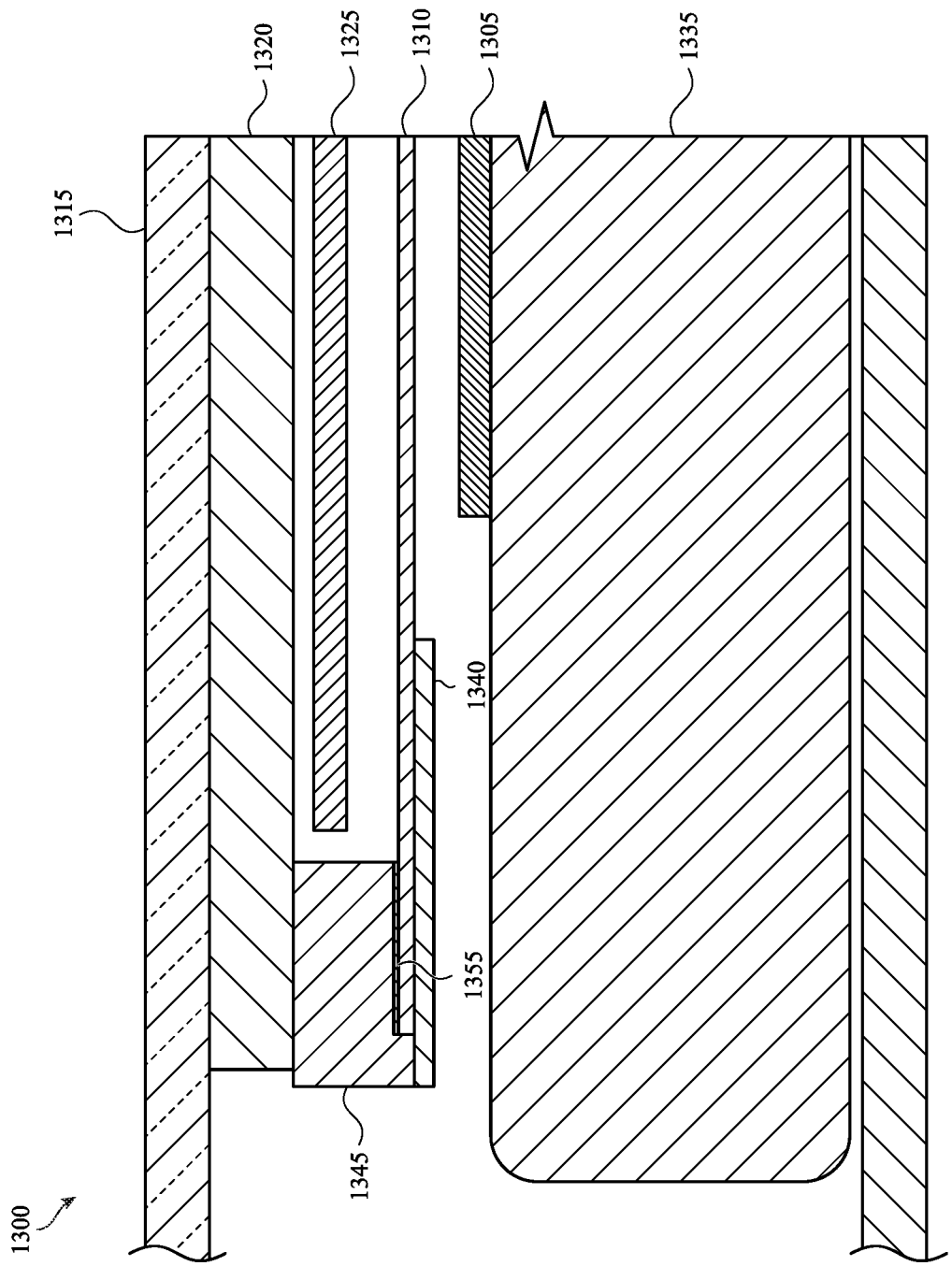
FIG. 16 illustrates a cross-section view of an example electronic device that incorporates a force-sensing element, a haptic structure and other components arranged in a fourth configuration.

FIG. 16 illustrates a cross-section view of an example electronic device 1300 in which the force-sensing element 1305, the haptic structure 1310, and the other components of the electronic device 1300 are arranged in a fourth configuration. In this particular embodiment, the various components may be arranged in a similar manner to the components shown and described with respect to FIG. 15. For example, the haptic structure 1310 may be coupled to the first support structure 1340 and/or the second support structure 1345 using an epoxy 1355 or a pressure sensitive adhesive. In addition, the electronic device 1300 may also include a cover glass 1315, a display 1320, a backlight assembly 1325 and a battery 1335.

However, in this implementation, a separate reflector may be omitted. More specifically, in this particular implementation, a reflector is integrated with the haptic structure 1310. For example, and as described above with respect to FIG. 9, the haptic structure 1310 includes, among other components, a top substrate and a bottom substrate. The reflector may act as the top substrate and the remaining portions of the haptic structure (e.g., the other components shown and described with respect to FIG. 9) are printed or otherwise coupled to a bottom surface of the top substrate. In another implementation, a reflective material may be printed or layered on the top surface of the top substrate of the haptic structure 1310.

In the embodiments shown and described with respect to FIGS. 13-16, the haptic structure 1310 and the force-sensing element 1305 may be stacked relative to one another. For example, the haptic structure 1310 and the force-sensing element 1305 may be coplanar. In such an arrangement, each component or electrode in the haptic structure 1310 may be aligned with or have the same or similar size as each element or electrode in the force-sensing element 1305.

For example, haptic pixels associated with or incorporated in the haptic structure 1310 may be similar in size or smaller in size than force-sensing pixels associated with or otherwise incorporated in the force-sensing element 1305. In other embodiments, the haptic pixels may be larger in size than the force-sensing pixels. In some implementations, the haptic pixels of the haptic structure 1310 may be aligned with the force-sensing pixels or otherwise arranged such that they are located within a perimeter of the force-sensing pixels of the force-sensing element 1305.

In some embodiments, trace routes of the haptic structure 1310 may be aligned with trace routes of the force-sensing element 1305 to avoid any interference between the two components.

Regardless of how the pixels are arranged, in order to make sure that the force-sensing element 1305 and the haptic structure 1310 do not interfere with one another, a floating element such as an electrode may be disposed on a bottom surface of the haptic structure 1310 and/or a top surface of the force-sensing element 1305. The floating electrodes may act as a shield to mitigate or eliminate cross-talks and/or parasitics between the components. Therefore, the force-sensing element 1305 may not affect readings or outputs associated with the haptic structure 1310, and the haptic structure 1310 may not affect readings or outputs associated with the force-sensing element 1305.

In the embodiments shown and described with respect to FIGS. 17-20C, the haptic structure 1310 and the force-sensing element 1305 are not necessarily stacked on top of one another. More specifically, the haptic structure 1310 and the force-sensing element 1305 may be offset but not coplanar or parallel and not coplanar.

Figure 17:
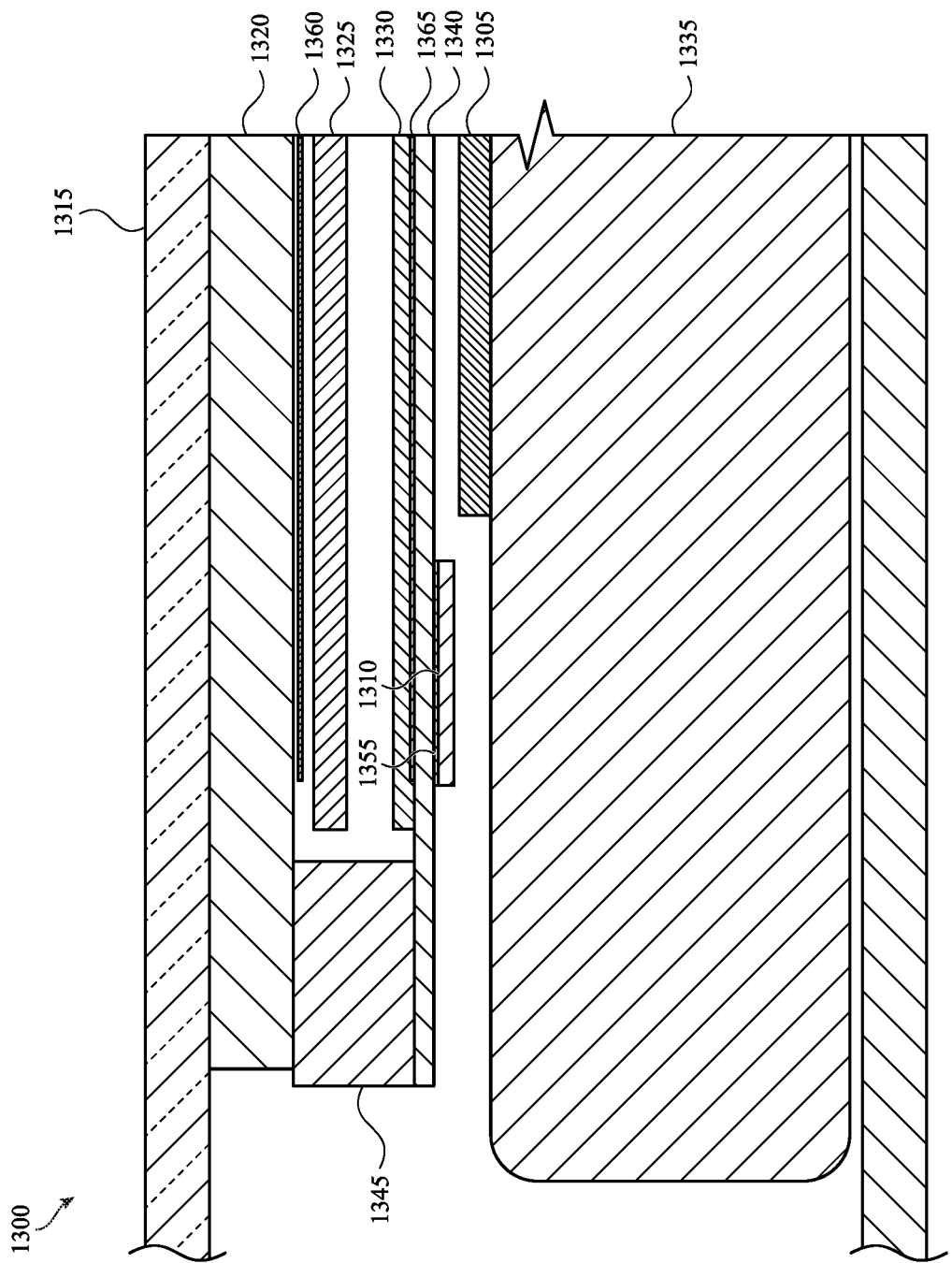
FIG. 17 illustrates a cross-section view of an example electronic device that incorporates a force-sensing element, a haptic structure and other components arranged in a fifth configuration.

FIG. 17 illustrates a cross-section view of an example electronic device 1300 in which the force-sensing element 1305, the haptic structure 1310 and the other components of the electronic device 1300 are arranged in a fifth configuration. More specifically, the configuration shown in FIG. 17 is similar to the configuration shown in FIG. 13 but the haptic structure 1310 is not coplanar with the force-sensing element 1305.

Although the haptic structure 1310 is not coplanar with the force-sensing element 1305, the haptic structure 1310 and force-sensing element 1305 function in a similar manner as described above. For example, in this configuration, the haptic structure 1310 is coupled to a first support structure 1340 (e.g., a non-conductive or non-metallic structure) using an epoxy 1355 or a pressure sensitive adhesive. When actuated, the haptic structure 1310 deflects or deforms which causes the first support structure 1340 and/or the second support structure 1345 to deform or deflect which causes the cover glass 1315 to deflect such as described above.

The electronic device 1300 also includes a first force-sensing component 1360 and a second force-sensing component 1365 that are used to determine an amount of force received on a cover glass 1315. These components may work in conjunction with the force-sensing element 1305 such as previously described. Likewise, the second force-sensing component 1365 may be omitted such as previously described. The electronic device 1300 also includes a display 1320, a backlight assembly 1325, a reflector 1330 and a battery 1335.

Figure 18:
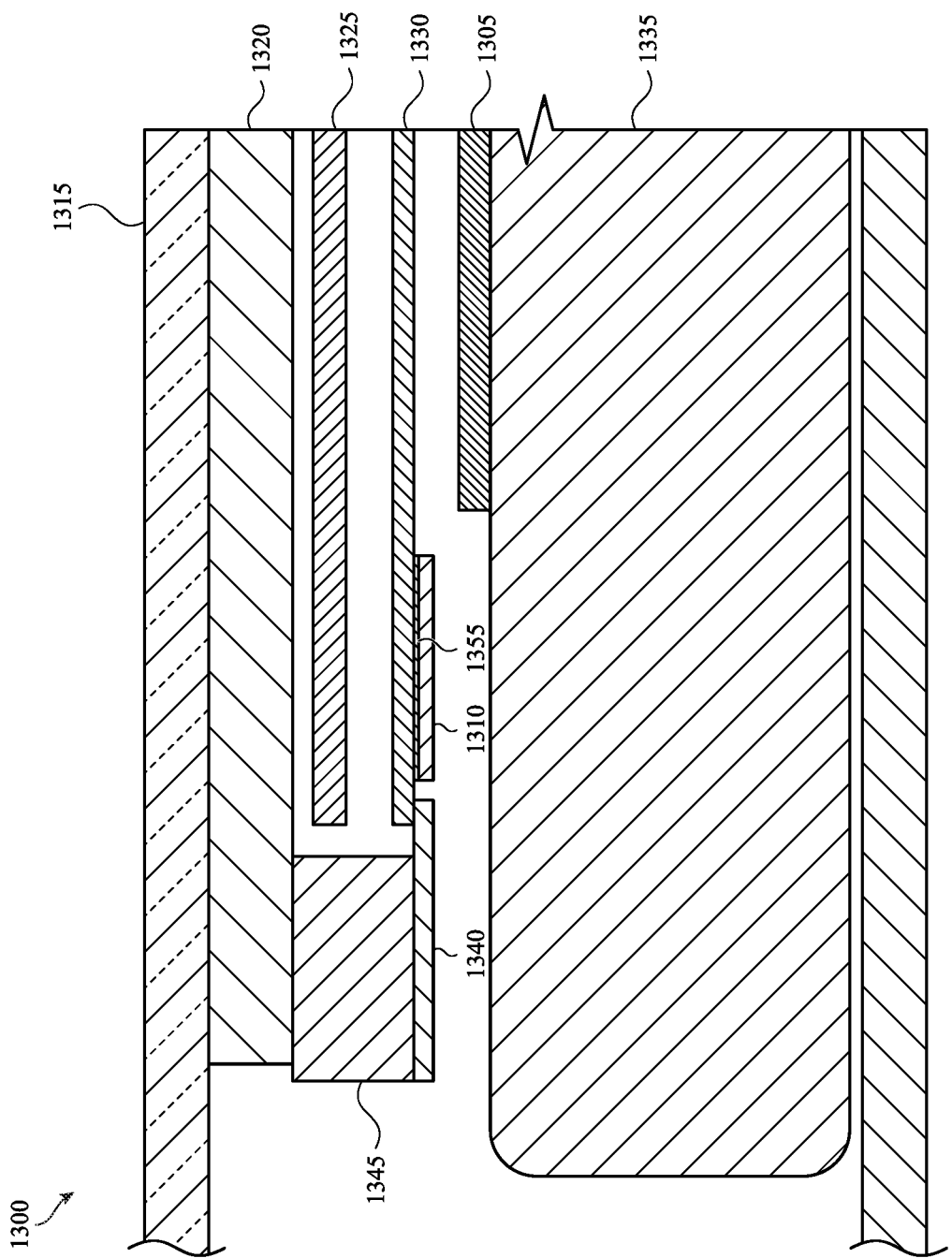
FIG. 18 illustrates a cross-section view of an example electronic device that incorporates a force-sensing element, a haptic structure and other components arranged in a sixth configuration.

FIG. 18 illustrates a cross-section view of an example electronic device 1300 in which the force-sensing element 1305, the haptic structure 1310, and the other components of the electronic device 1300 (e.g., the cover glass 1315, the display 1320, the backlight assembly 1325, the reflector 1330, and the battery 1335) are arranged in a sixth configuration. The configuration of the components shown in FIG. 18 may be similar to the configuration of the components shown and described with respect to FIG. 14.

More specifically, the haptic structure 1310 may be coupled to a back surface of a reflector 1330 using an epoxy 1355 or a pressure sensitive adhesive. The top side of the reflector 1330 may be layered or otherwise covered with a reflective material such as described above. However, in this implementation, the haptic structure 1310 may be patterned or otherwise positioned adjacent the force-sensing element 1305.

When actuated, the haptic structure 1310 deflects the reflector 1330 which causes the first support structure 1340 and/or the second support structure 1345 to deflect. As a result, the cover glass 1315 may also be deflected such as described above.

Figure 19:
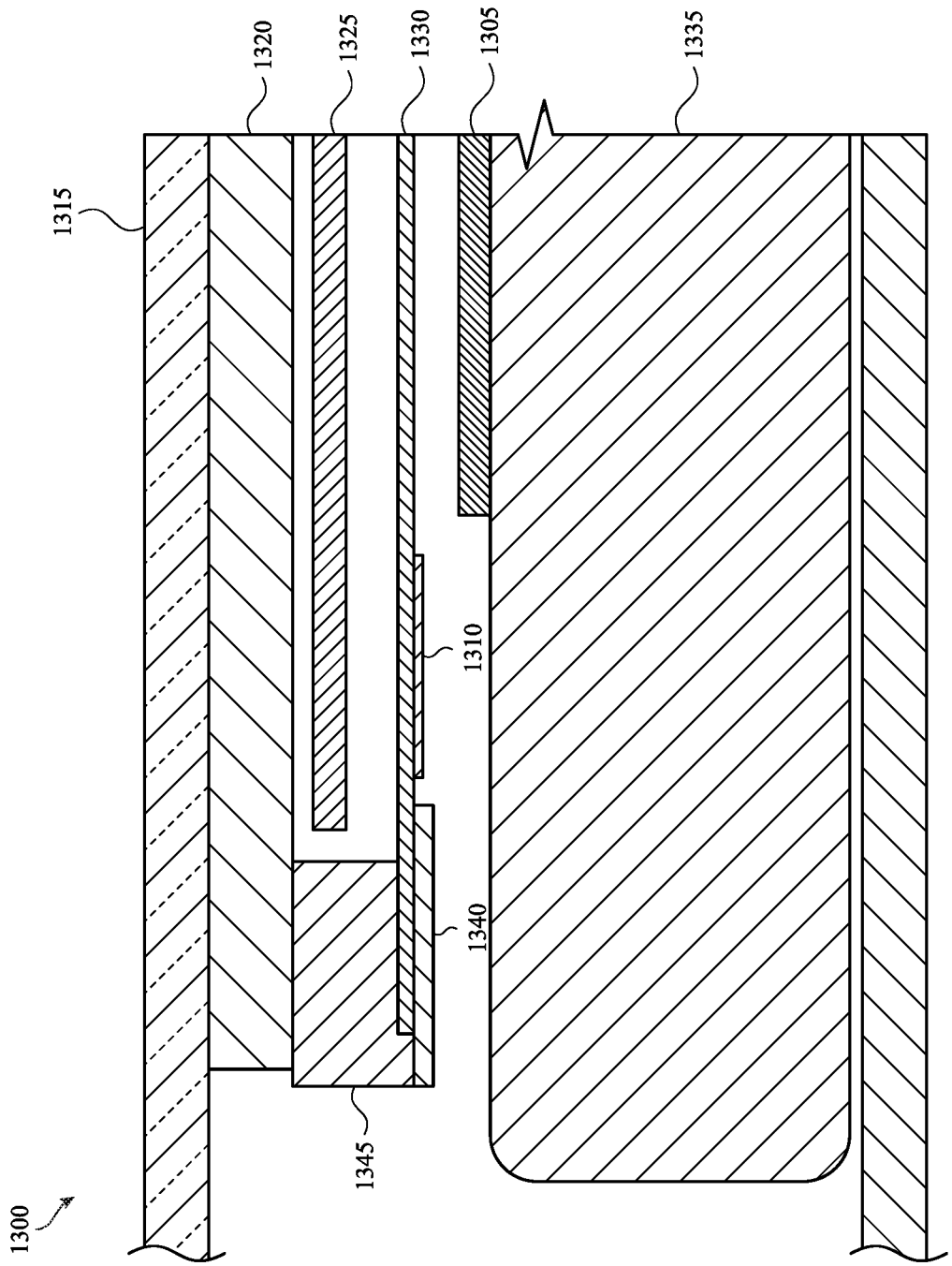
FIG. 19 illustrates a cross-section view of an example electronic device that incorporates a force-sensing element, a haptic structure and other components arranged in a seventh configuration.

FIG. 19 illustrates a cross-section view of an example electronic device 1300 in which the force-sensing element 1305, the haptic structure 1310 and the other components of the electronic device 1300 arranged in a seventh configuration. In this implementation, the electronic device 1300 also includes a cover glass 1315, a display 1320, a backlight assembly 1325, a reflector 1330 and a battery 1335.

The haptic structure 1310 in this particular implementation may be formed on the reflector 1330. More specifically, the haptic structure 1310 is integrated with a portion of the reflector 1330. As such, the reflector 1330 may act as a top substrate for the haptic structure 1310. The remaining components of the haptic structure 1310 (e.g., the other components shown and described with respect to FIG. 9) may be printed or otherwise coupled to a bottom surface of the top substrate such as described above. The peripheral edges of the reflector 1330 may be coupled to the first support structure 1340 and the second support structure 1345. Because the peripheral edges of the reflector 1330 are coupled in such a manner, actuation of the haptic structure 1310 may cause the reflector 1330 to more easily bend in the manner described above.

Because the haptic structure 1310 is integrated with only a portion of the reflector 1330, the haptic structure 1310 may include a ceramic or other such material. Although not required, inclusion of this material may enable the haptic structure 1310 to better withstand the deflection and deformation processes as well as other stresses that may be placed on the haptic structure 1310.

Figure 20A:
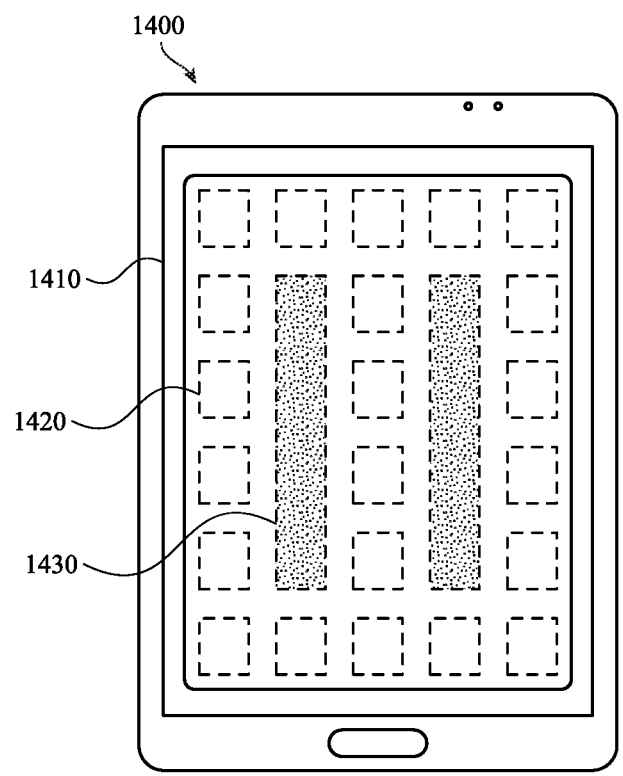
FIG. 20A illustrates a first example layout of multiple haptic structures and multiple force-sensing elements for an electronic device.
Figure 20B:
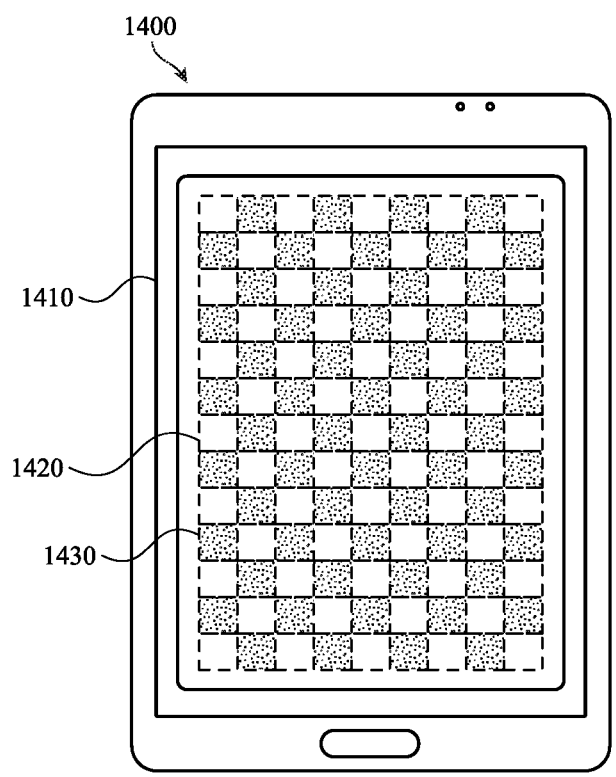
FIG. 20B illustrates a second example layout of multiple haptic structures and multiple force-sensing elements for an electronic device.
Figure 20C:
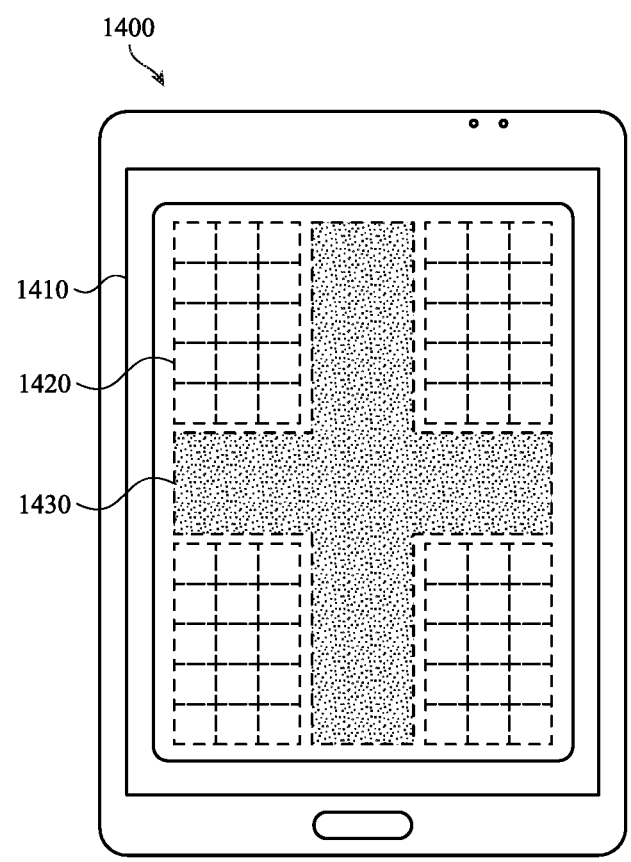
FIG. 20C illustrates a third example layout of multiple haptic structures and a force-sensing element for an electronic device.

FIGS. 20A-20C illustrate example layouts of haptic structures 1420 and force-sensing elements 1430 for an electronic device 1400. The various arrangements, patterns, and sizes of the haptic structures 1420 and the force-sensing elements 1430 are examples and should not be taken in a limiting sense.

More specifically, the force-sensing elements 1430 and the haptic structures 1420 may have various shapes and sizes and may be arranged in numerous configurations. In addition, haptic structures 1420 and/or force-sensing elements 1430 of a first size or orientation may be used in some locations while other different sized haptic structures 1420 and/or force-sensing elements 1430 may be used in other locations within a single electronic device 1400.

Each haptic structure 1420 and/or each force-sensing element 1430 may be positioned on different layers within the electronic device 1400. For example, if a transparent piezoelectric material is used to create the haptic structure 1420, the haptic structure 1420 may be placed nearer the cover glass of the electronic device 1400.

In other implementations, and as described above, the electronic device 1400 may include multiple layers of haptic structures 1420 and/or multiple layers of force-sensing elements 1430. For example, the electronic device 1400 may include a first layer of haptic structures 1420 that deform or deflect in a first direction or in a first manner and a second layer of haptic structures 1420 that deform or deflect in a second direction or in a second manner that is different from the first direction and/or first manner.

In such implementations, each haptic structure 1420 in each of the layers may be actuated at various times to either offset the haptic output or enhance the haptic output provided by the haptic structures 1420. In addition, each layer may be made of different materials. For example, a layer of haptic structures 1420 that is nearer the cover glass of the electronic device 1400 may be made of a transparent material while a layer of haptic structures 1420 that is farther away from the cover glass may be made of an opaque material.

In another implementation, various components, such as the components described above, may be omitted from the electronic device 1400 in certain areas. For example, a support structure 1410 may be provided adjacent the haptic structures 1420 and the force sensing elements 1430 (e.g., such as, for example, around a perimeter of the electronic device 1400) but omitted from the center of the electronic device 1400.

In the embodiments described below, each haptic structure 1420 in the following example embodiments may be driven at different times and at different locations to achieve a desired localization and haptic output such as described above. In addition, the force-sensing elements 1430 may be arranged at different locations and in different patterns in order to detect received force input. For example, and as shown in FIG. 20A, the electronic device 1400 may have two force-sensing elements 1430. These force-sensing elements 1430 may be surrounded by, inset or otherwise aligned with various haptic structures 1420.

In the example embodiment shown in FIG. 20B, the electronic device 1400 includes patterns of alternating haptic structures 1420 and force-sensing elements 1430. In some implementations, the support structure 1410 may be located around a perimeter of the alternating structures. In FIG. 20C, the electronic device 1400 may be divided into four quadrants or regions by the force-sensing element 1430 with each quadrant or region having various haptic structures 1420. Like the previous embodiments, a support structure 1410 may be located adjacent to some of the haptic structures 1420 and portions of the force sensing elements 1430.

In the embodiments described above, the haptic structures and the force-sensing elements may work in combination to determine the amount of force that is provided to the electronic device. For example, the haptic structure outputs a voltage when it is deflected, bent, or under strain while the force-sensing element measures an amount of deflection. Accordingly, the voltage that is output by the haptic structure may be used to help the force-sensing element determine a received amount of force.

In another embodiment, the force-sensing element or other component of the electronic device may track a history of received force input. Likewise, the haptic structure may track or map where haptic output has been provided. Using this information, the computing device may be better able to track received input and provided output and increase sensitivity in those areas.

Figure 21:
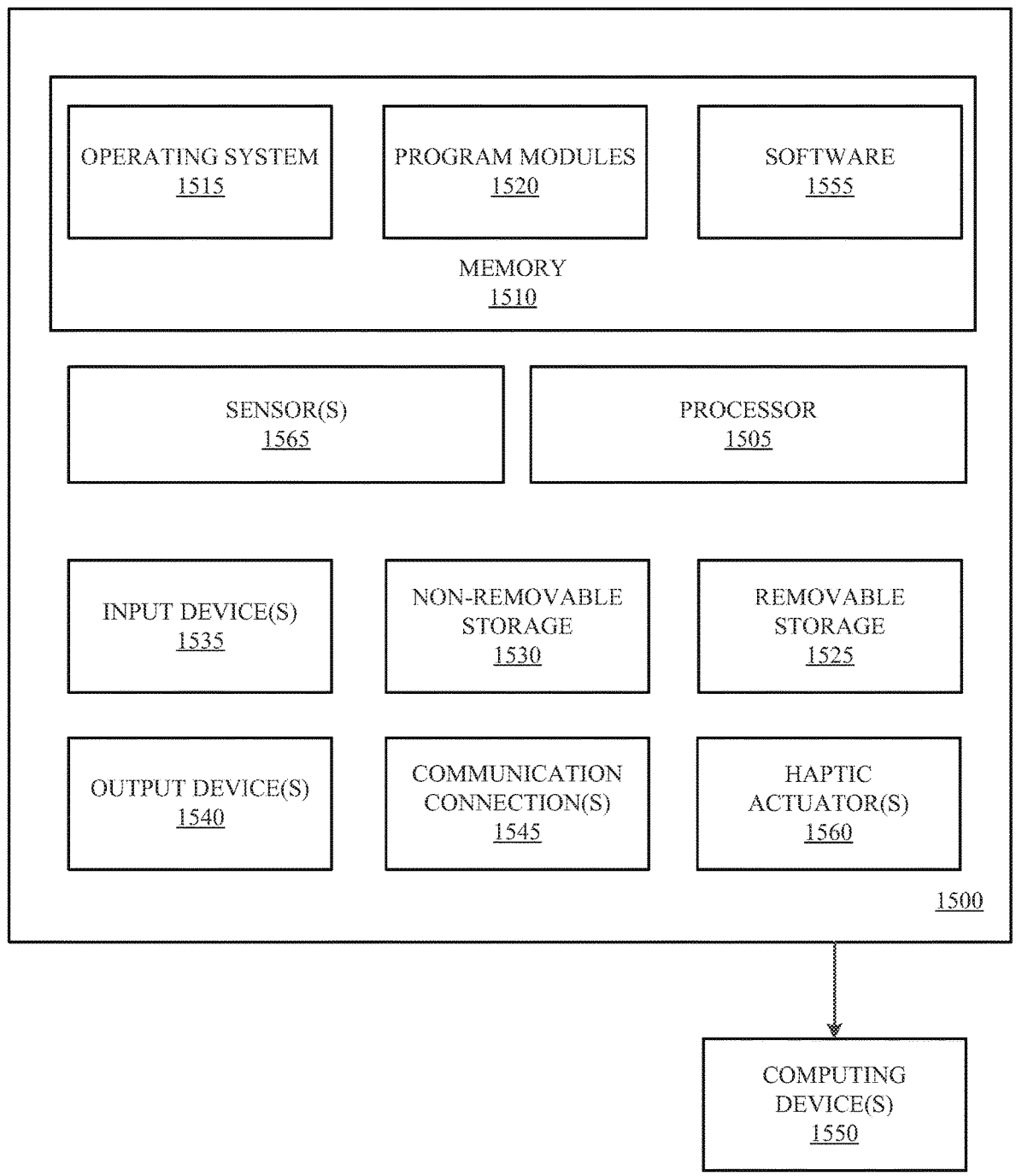
FIG. 21 illustrates example components of an electronic device.

FIG. 21 is a block diagram illustrating example components, such as, for example, hardware components, of an electronic device 1500 according to one or more embodiments of the present disclosure. In certain embodiments, the electronic device 1500 may be similar to the electronic devices 100 described above. Although various components of the electronic device 1500 are shown, connections and communication channels between each of the components are omitted for simplicity.

In a basic configuration, the electronic device 1500 may include at least one processor 1505 or processing unit and a memory 1510. The processor 1505 may be used to determine the location of a received input and which actuator structures should be driven. The memory 1510 may comprise, but is not limited to, volatile storage, such as random access memory, nonvolatile storage, such as read-only memory, flash memory, or any combination thereof. The memory 1510 may store an operating system 1515 and one or more program modules 1520 suitable for running software applications 1555. The operating system 1515 may be configured to control the electronic device 1500 and/or one or more software applications 1555 being executed by the operating system 1515. The software applications 1555 may include browser applications, e-mail applications, calendaring applications, contact manager applications, messaging applications, games, media player applications, time keeping applications, and the like.

The electronic device 1500 may have additional features or functionality than those expressly described herein. For example, the electronic device 1500 may also include additional data storage devices, removable and non-removable, such as, for example, magnetic disks, optical disks, or tape. Example storage devices are illustrated in FIG. 21 by removable storage device 1525 and a non-removable storage device 1530. In certain embodiments, various program modules and data files may be stored in the memory 1510.

As also shown in FIG. 21, the electronic device 1500 may include one or more input devices 1535. The input devices 1535 may include a trackpad, a keyboard, a mouse, a pen or stylus, a sound input device, a touch input device, a force-sensing element and the like. The electronic device 1500 may also include one or more output devices 1540. The output devices 1540 may include a display, one or more speakers, a printer, and the like. The electronic device 1500 may also include one or more haptic actuators 1560 such as described herein. In other embodiments, the haptic actuators 1560 may be configured to provide both haptic and audio output.

The electronic device 1500 may also include one or more sensors 1565. The sensors may include, but are not limited to, force sensors, pressure sensors, altimeters, touch identification sensors, accelerometers, temperature sensors, ambient light sensors, photodiodes, gyroscopes, magnetometers, and so on.

The electronic device 1500 also includes communication connections 1545 that facilitate communications with additional computing devices 1550. Such communication connections 1545 may include a RF transmitter, a receiver, and/or transceiver circuitry, universal serial bus (USB) communications, parallel ports, and/or serial ports.

As used herein, the term computer-readable media may include computer storage media. Computer storage media may include volatile and nonvolatile media and/or removable and non-removable media implemented in any method or technology for the storage of information. Examples include computer-readable instructions, data structures, or program modules. The memory 1510, the removable storage device 1525, and the non-removable storage device 1530 are all examples of computer storage media. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the electronic device 1500. Any such computer storage media may be part of the electronic device 1500.

In certain embodiments, the electronic device 1500 includes a power supply such as a battery, a solar cell, and the like that provides power to each of the components shown. The power supply may also include an external power source, such as an AC adapter or other such connector that supplements or recharges the batteries. The electronic device 1500 may also include a radio that performs the function of transmitting and receiving radio frequency communications. Additionally, communications received by the radio may be disseminated to the application programs. Likewise, communications from the application programs may be disseminated to the radio as needed.

Embodiments of the present disclosure are described above with reference to block diagrams and operational illustrations of methods and the like. The operations described may occur out of the order as shown in any of the figures. Additionally, one or more operations may be removed or executed substantially concurrently. For example, two blocks shown in succession may be executed substantially concurrently. Additionally, the blocks may be executed in the reverse order.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A haptic structure comprising:
   a substrate; and
   a haptic actuator, mechanically coupled to and extending upward from the substrate and comprising,
      a piezoelectric material; and
      at least one electrode coupled to the piezoelectric material;
   wherein:
      an electrical input received by the at least one electrode causes the haptic actuator to bend the substrate; and
      the substrate includes a channel at least partially surrounding an area of the substrate to which the haptic actuator is mechanically coupled, the channel extending into the substrate and below an interface between the haptic actuator and the substrate.

2. The haptic structure of claim 1, wherein the substrate is coupled to a side of a cover glass of an electronic device, the side being interior to the electronic device.

3. The haptic structure of claim 1, wherein the channel extends through the substrate.

4. The haptic structure of claim 1, wherein the channel extends only partially through the substrate.

5. The haptic structure of claim 1, wherein:
   the area of the substrate to which the haptic actuator is mechanically coupled is a rectangular area; and
   the channel extends around three sides of the rectangular area.

6. The haptic structure of claim 1, wherein:
   the area of the substrate to which the haptic actuator is mechanically coupled is a rectangular area;
   the channel is a first channel extending parallel to a first side of the rectangular area, and parallel to portions of a second side of the rectangular area and a third side of the rectangular area; and
   the substrate includes a second channel extending parallel to a fourth side of the rectangular area, and parallel to portions of the second side of the rectangular area and the third side of the rectangular area.

7. The haptic structure of claim 1, wherein:
   the area of the substrate to which the haptic actuator is mechanically coupled is a rectangular area;
   the channel is a first channel extending parallel to a first side of the rectangular area;
   the substrate includes a second channel extending parallel to a second side of the rectangular area;
   the substrate includes a third channel extending parallel to a third side of the rectangular area; and
   the substrate includes a fourth channel extending parallel to a fourth side of the rectangular area.

8. The haptic structure of claim 1, wherein the channel at least partially localizes the bending of the substrate to the area of the substrate to which the haptic actuator is mechanically coupled.

9. An electronic device comprising:
   a cover glass with a first side forming an exterior surface of the electronic device;
   a display having a first side coupled to a second side of the cover glass, the second side of the cover glass opposite to the first side of the cover glass;
   a first support structure proximate to a second side of the display, the second side of the display opposite to the first side of the display, and the first support structure separated from the second side of the display to form a space between the display and the first support structure;
   a second support structure coupled to the second side of the display and the first support structure;
   a backlight assembly positioned at least partially in the space;
   a haptic structure mechanically linked to the first support structure;
   a battery positioned in the electronic device proximate to the first support structure and opposite to the display; and
   a force sensing element positioned between the battery and the first support structure,
   wherein:
      the haptic structure is operable to cause a deflection of the cover glass in response to a signal applied to the haptic structure; and
      the force sensing element is operable to detect an amount of force applied to the cover glass.

10. The electronic device of claim 9, further comprising a reflector coupled at least partially to the first support structure, and positioned between the first support structure and the backlight assembly.

11. The electronic device of claim 10, wherein:
   the haptic structure is coupled to the reflector opposite to the backlight assembly; and
   the reflector is coupled partially to the first support structure.

12. The electronic device of claim 10, wherein:
the haptic structure is coupled to the first support structure opposite to the space between the display and the first support structure; and
the haptic structure is positioned between the force sensing element on the battery and the first support structure.

13. The electronic device of claim 12, further comprising:
a first force sensing component coupled to the display opposite to the cover glass; and
a second force sensing component coupled to the first support structure.

14. The electronic device of claim 9, further comprising a reflector integrated with the haptic structure.

15. The electronic device of claim 9, wherein the display is a touch sensitive display.

16. An electronic device comprising:
a cover glass with a first side forming an exterior surface of the electronic device;
a display having a first side coupled to a second side of the cover glass, the second side of the cover glass opposite to the first side of the cover glass;
a first support structure proximate to a second side of the display, the second side of the display opposite to the first side of the display, and the first support structure separated from the second side of the display to form a space between the display and the first support structure;
a second support structure coupled to the second side of the display and the first support structure;
a reflector positioned at least partially within the space and coupled to the first support structure;
a backlight assembly positioned at least partially in the space, between the reflector and the display;
a haptic structure mechanically linked to the first support structure;
a battery positioned in the electronic device proximate to the first support structure and opposite to the display; and
a force sensing element positioned between the battery and the first support structure,
wherein:
the haptic structure is operable to cause a deflection of the cover glass in response to an applied signal;
the haptic structure is positioned to provide a gap between the force sensing element and the first support structure; and
the force sensing element is operable to detect an amount of force applied to the cover glass.

17. The electronic device of claim 16, wherein the reflector is integrated with the haptic structure.

18. The electronic device of claim 16, further comprising a force sensing component,
wherein:
the force sensing component is coupled to the second side of the display; and
the force sensing component is operable to work in conjunction with the force sensing element to determine the amount of force applied to the cover glass.

19. The electronic device of claim 16, wherein the haptic structure is coupled to the reflector.

20. The electronic device of claim 19, wherein the reflector is coupled to the first support structure at a peripheral edge of the reflector.

* * * * *